(12) United States Patent  
Ned et al.

(10) Patent No.: US 9,322,730 B2  
(45) Date of Patent: Apr. 26, 2016

(54) SENSOR CO-LOCATED WITH AN ELECTRONIC CIRCUIT

(71) Applicant: Kulite Semiconductor Products, Inc., Leonia, NJ (US)

(72) Inventors: Alexander A. Ned, Kinnelon, NJ (US); Sorin Stefanescu, New Milford, NJ (US); Louis DeRosa, Wayne, NJ (US); Joseph R. VanDeWeert, Maywood, NJ (US)

(73) Assignee: Kulite Semiconductor Products, Inc., Leonia, NJ (US)

( * ) Notice: Subject to any disclaimer, the term of this patent is extended or adjusted under 35 U.S.C. 154(b) by 0 days.

(21) Appl. No.: 14/451,550

(22) Filed: Aug. 5, 2014

(65) Prior Publication Data

US 2016/0041053 A1    Feb. 11, 2016

(51) Int. Cl.
*H01L 29/66* (2006.01)
*G01L 9/00* (2006.01)
*H01L 25/16* (2006.01)

(52) U.S. Cl.
CPC ............ *G01L 9/0054* (2013.01); *H01L 25/167* (2013.01)

(58) Field of Classification Search
CPC ............................ G01L 9/0054; H01L 25/167
See application file for complete search history.

(56) References Cited

U.S. PATENT DOCUMENTS

2004/0197953 A1 * 10/2004 Funk .............................. 438/108

* cited by examiner

*Primary Examiner* — Long Pham
(74) *Attorney, Agent, or Firm* — Troutman Sanders LLP; James E. Schutz; Mark Lehi Jones

(57) ABSTRACT

This disclosure provides example methods, devices, and systems for a sensor co-located with an electronic circuit. In one embodiment, a sensor assembly may comprise a semiconductor device configured to include a sensor having a sensing element, an electronic circuit and wherein the sensing element and the electronic circuit are hermetically sealed in the same sensor assembly; and wherein the sensor assembly is capable of outputting an environmental condition signal associated with an environmental condition measured by the sensor.

19 Claims, 31 Drawing Sheets

US 9,322,730 B2

SENSOR CO-LOCATED WITH AN ELECTRONIC CIRCUIT

FIELD

This invention relates to sensors and more particularly to a sensor co-located with an electronic circuit.

BACKGROUND

In many sensing applications, the correct operation of the sensing element may require device packaging suitable for harsh sensing environments. Various approaches may be used to achieve such packaging. For example, an oil-filled construction approach may include a metal diaphragm positioned in front of the sensing element and the space between the metal diaphragm and the sensing element may be filled with an incompressible fluid such as oil. Further, an environmental condition such as pressure may be applied to the metal diaphragm with the environmental condition transferred to the sensing element using the incompressible fluid. For this approach, the metal diaphragm may protect the sensing element from the environmental condition.

For harsh, high temperature, rugged environments, a leadless packaging approach may be used to achieve alternative construction for hermetically packaging sensors such as described by U.S. Pat. No. 5,955,771, entitled "SENSORS FOR USE IN HIGH VIBRATIONAL APPLICATIONS AND METHODS FOR FABRICATING SAME," issued on Sep. 21, 1999 to A. D. Kurtz et al. and assigned to Kulite Semiconductor Products Inc., the assignee herein. The leadless packaging approach may enable the sensing network to be hermetically protected in an inert environment, while exposing only the backside of the deflecting silicon diaphragm to the environmental condition. Although these packaging approaches are applicable for use in sensors, in many applications however, in addition to the sensor network, an electronic circuit such as signal conditioning electronics may need to be incorporated into the design, for instance, to achieve an accurate, high-level output signal.

For example, FIG. 1 illustrates a prior art electronic circuit 100 that may be integrated with a sensor. In FIG. 1, the prior art electronic circuit 100 includes a piezoresistive bridge 110 and analog interface 120. The piezoresistive bridge 110 includes piezoresistors 112 113 114 115, which are configured as a Wheatstone bridge. The analog interface 120 includes a voltage regulator 121 and an amplifier 123. The voltage regulator 121 supplies a bias voltage to the piezoresistive bridge 110. Further, the piezoresistive bridge 110 is electrically coupled to ground using a span resistor 117. The piezoresistive bridge 110 measures a pressure applied to a semiconductor diaphragm to obtain and output a pressure signal. The amplifier 123 then modifies an amplitude of the pressure signal. The prior art electronic circuit 100 of FIG. 1 is well known in the art and, for instance, reference is made to U.S. Pat. No. 7,861,597, entitled "HIGH TEMPERATURE TRANSDUCER USING SOI ELECTRONICS," issued to A. D. Kurtz and assigned to Kulite Semiconductor Products, Inc, the assignee herein.

There is a need for techniques to allow for a sensor to be co-located with a circuit, for example, for operating in harsh environments, or over a certain temperature range. An oil-filled construction of the sensor is one possible option. However, it may require the electronic circuit such as signal conditioning electronics to be in contact with the oil in the cavity of the sensor, which may affect the performance, quality or reliability of the electronic circuit. Additionally, the use of an oil-filled construction of the sensor may also limit a temperature range of the packaged sensor due to, for instance, temperature limitations of the oil. An alternative construction or packaging of the sensor with the electronic circuit may be required to facilitate accurate device operation in harsh environments or over a certain temperature range. Accordingly, there is a need for techniques to allow for a sensor to be co-located with a circuit operating in harsh environments or over a certain temperature range.

Other desirable features and characteristics of the present disclosure will become apparent from the subsequent detailed description and claims, taken in conjunction with the accompanying figures and the foregoing technical field and background.

BRIEF SUMMARY

Briefly described, embodiments of the present disclosure relate to a sensor co-located with an electronic circuit. In one example embodiment, a sensor assembly may be configured to include a semiconductor device and a header assembly. The semiconductor device may be configured to include a sensor having a sensing element and an electronic circuit. Further, the sensing element and the electronic circuit may be hermetically sealed. The header assembly may be configured to include a header glass (and/or a header ceramic) and a first set of header pins. The first set of header pins may be electrically coupled to the electronic circuit. In addition, the sensor assembly may be capable of outputting an environmental condition signal associated with or responsive to an environmental condition measured by the sensor.

According to an example implementation, the sensing element and the electronics may be hermetically sealed in the same package. In one example implementation, the sensing components and the electronics may be hermetically sealed in the same enclosure of the package using, for example, a cover such as a contact glass. In another example implementation, the sensing components and the electronics may be hermetically sealed in corresponding enclosures and placed in the same sensor assembly package.

BRIEF DESCRIPTION OF THE FIGURES

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, where:

FIG. 2A is a perspective view of the semiconductor device. FIG. 2B is a top view of the semiconductor device. FIG. 2C is a cross-sectional side view of the semiconductor device.

FIG. 3A is an unassembled cross-sectional side view of the sensor assembly. FIG. 3B is an assembled cross-sectional side view of the sensor assembly.

FIG. 4A is a perspective view of the semiconductor device. FIG. 4B is a top view of the semiconductor device. FIG. 4C is a cross-sectional side view of the semiconductor device.

FIG. 5A is an unassembled cross-sectional side view of the sensor assembly. FIG. 5B is an assembled cross-sectional side view of the sensor assembly.

FIG. 6A is a perspective view of the semiconductor device. FIG. 6B is a top view of the semiconductor device. FIG. 6C is a cross-sectional side view of the semiconductor device.

FIG. 7A is an unassembled cross-sectional side view of the sensor assembly. FIG. 7B is an assembled cross-sectional side view of the sensor assembly.

FIG. 8A is a perspective view of the sensor semiconductor device. FIG. 8B is a top view of the sensor semiconductor device. FIG. 8C is a cross-sectional side view of the sensor semiconductor device.

FIG. 9A is a perspective view of the electronic circuit semiconductor device. FIG. 9B is a top view of the electronic circuit semiconductor device. FIG. 9C is a cross-sectional side view of the electronic circuit semiconductor device.

FIG. 10A is an unassembled cross-sectional side view of the sensor assembly. FIG. 10B is an assembled cross-sectional side view of the sensor assembly.

FIG. 11A is a perspective view of the sensor semiconductor device. FIG. 11B is a top view of the sensor semiconductor device. FIG. 11C is a cross-sectional side view of the sensor semiconductor device.

FIG. 12A is a perspective view of the electronic circuit semiconductor device. FIG. 12B is a top view of the electronic circuit semiconductor device. FIG. 12C is a cross-sectional side view of the electronic circuit semiconductor device.

FIG. 13A is an unassembled cross-sectional side view of the sensor assembly. FIG. 13B is an assembled cross-sectional side view of the sensor assembly.

DETAILED DESCRIPTION

Figure 1:
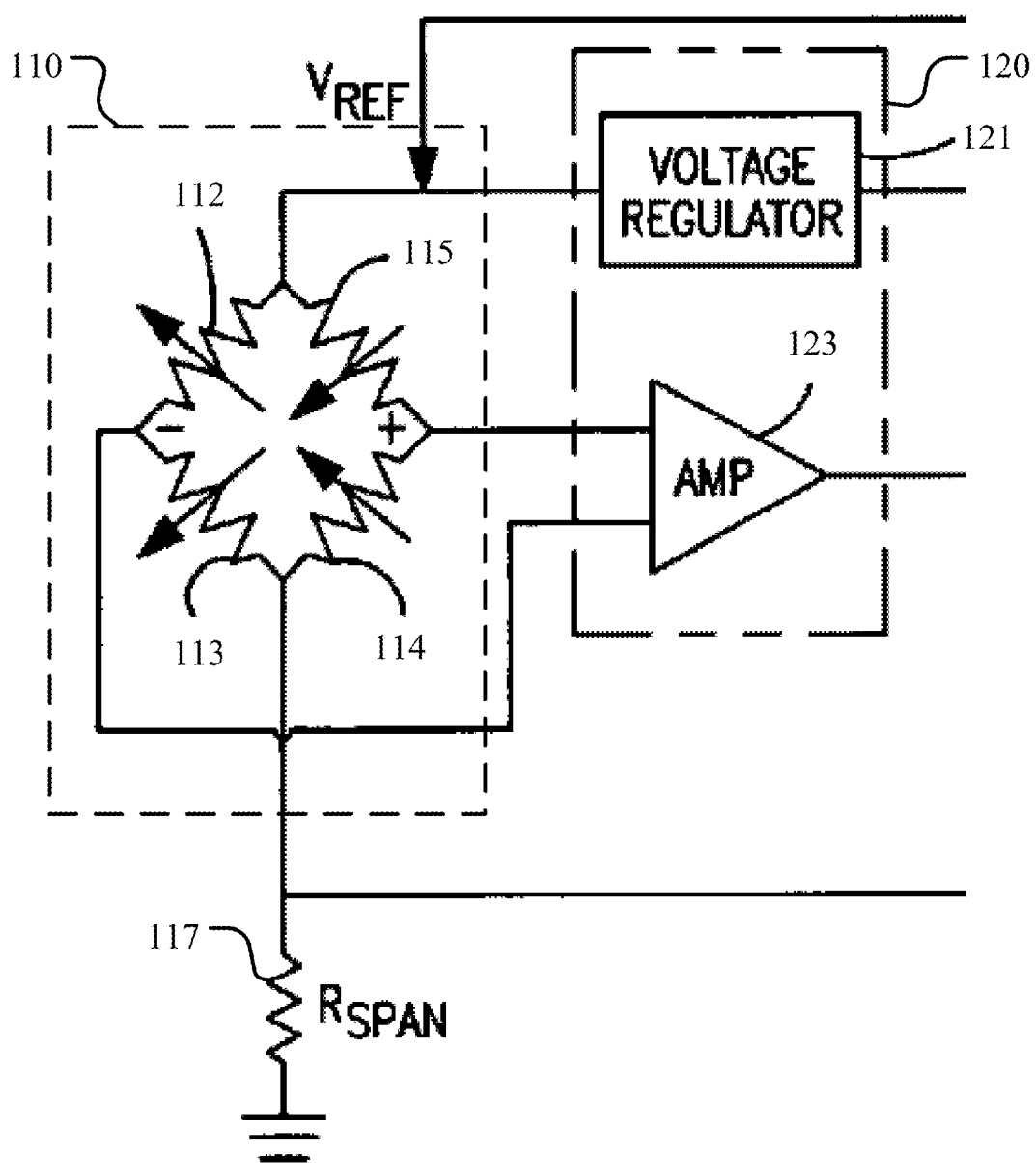
FIG. 1 illustrates a prior art electronic circuit that may be integrated with a sensor.

The following detailed description is merely illustrative in nature and is not intended to limit the present disclosure, or the application and uses of the present disclosure. Furthermore, there is no intention to be bound by any expressed or implied theory presented in the preceding field of use, background, or summary of the disclosure or the following detailed description. The present disclosure provides various examples, embodiments and the like, which may be described herein in terms of functional or logical block elements. Various techniques described herein may be used for a sensor co-located with an electronic circuit. The various aspects described herein are presented as methods, devices (or apparatus), and systems that may include a number of components, elements, members, modules, nodes, peripherals, or the like. Further, these methods, devices, and systems may include or not include additional components, elements, members, modules, nodes, peripherals, or the like.

Throughout the specification and the claims, the following terms take at least the meanings explicitly associated herein, unless the context clearly dictates otherwise. The terms "connect," "connecting," and "connected" mean that one function, feature, structure, or characteristic is directly joined to or in communication with another function, feature, structure, or characteristic. The terms "couple," "coupling," and "coupled" mean that one function, feature, structure, or characteristic is directly or indirectly joined to or in communication with another function, feature, structure, or characteristic. Relational terms such as "first" and "second," and the like may be used solely to distinguish one entity or action from another entity or action without necessarily requiring or implying any actual such relationship or order between such entities or actions. The term "or" is intended to mean an inclusive or. Further, the terms "a," "an," and "the" are intended to mean one or more unless specified otherwise or clear from the context to be directed to a singular form. The term "include" and its various forms are intended to mean "including but not limited to." The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%.

In the following description, numerous specific details are set forth. However, it is to be understood that embodiments of the disclosed technology may be practiced without these specific details. References to "one embodiment," "an embodiment," "example embodiment," "various embodiments," and other like terms indicate that the embodiments of the disclosed technology so described may include a particular function, feature, structure, or characteristic, but not every embodiment necessarily includes the particular function, feature, structure, or characteristic. Further, repeated use of the phrase "in one embodiment" does not necessarily refer to the same embodiment, although it may.

Certain example implementations of the disclosed technology provide systems, methods and techniques for co-locating electronic circuitry adjacent to a sensing element. The example embodiments disclosed herein may be utilized to increase signal-to-noise ratio of the system; reduce a total size of the package(s); and/or protect the electronic circuitry.

This disclosure presents a sensor co-located with an electronic circuit. By configuring a sensor in accordance with various aspects described herein, an improved capability of the sensor is provided. Hermetically packaging a sensing element with an electronic circuit in a leadless-type configuration, as disclosed herein, may provide improved capability, which may be suitable for high temperature or rugged applications. In this configuration, the electronic circuit may be contemporaneously fabricated on the same patterned silicon-on-insulator (SOI) wafer as the sensing network of the sensor. Further, the electronic circuit may be diffused onto the diaphragm of the sensor or may be integrated with the sensing network of the sensor. In certain example implementations, the integration and interconnections of the electronic circuit and the sensor may be achieved using wafer-level processing or micro-fabrication techniques.

Figure 2A:
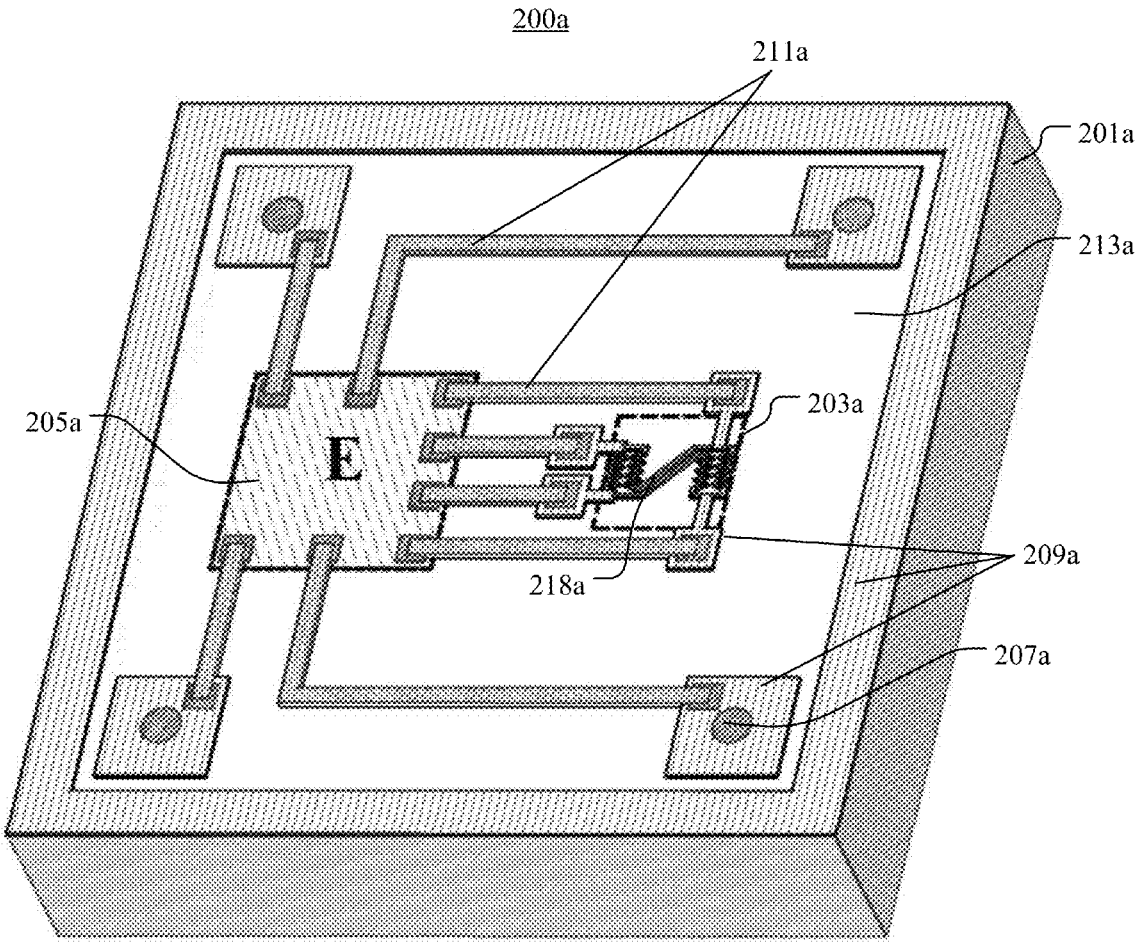
FIGS. 2A-2C are various views of one embodiment of a semiconductor device having a sensor co-located with an electronic circuit in accordance with various aspects set forth herein.
Figure 2B:
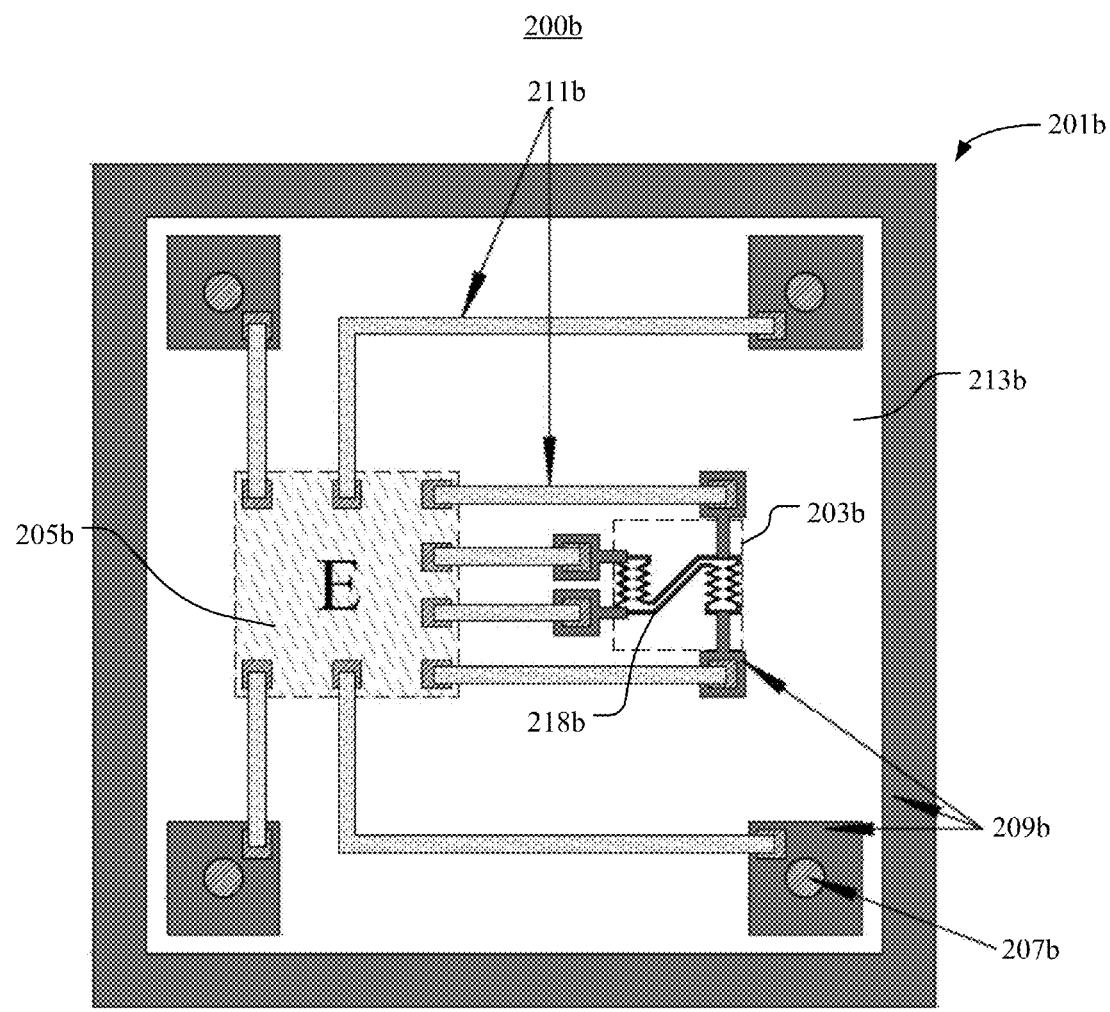
Figure 2C:
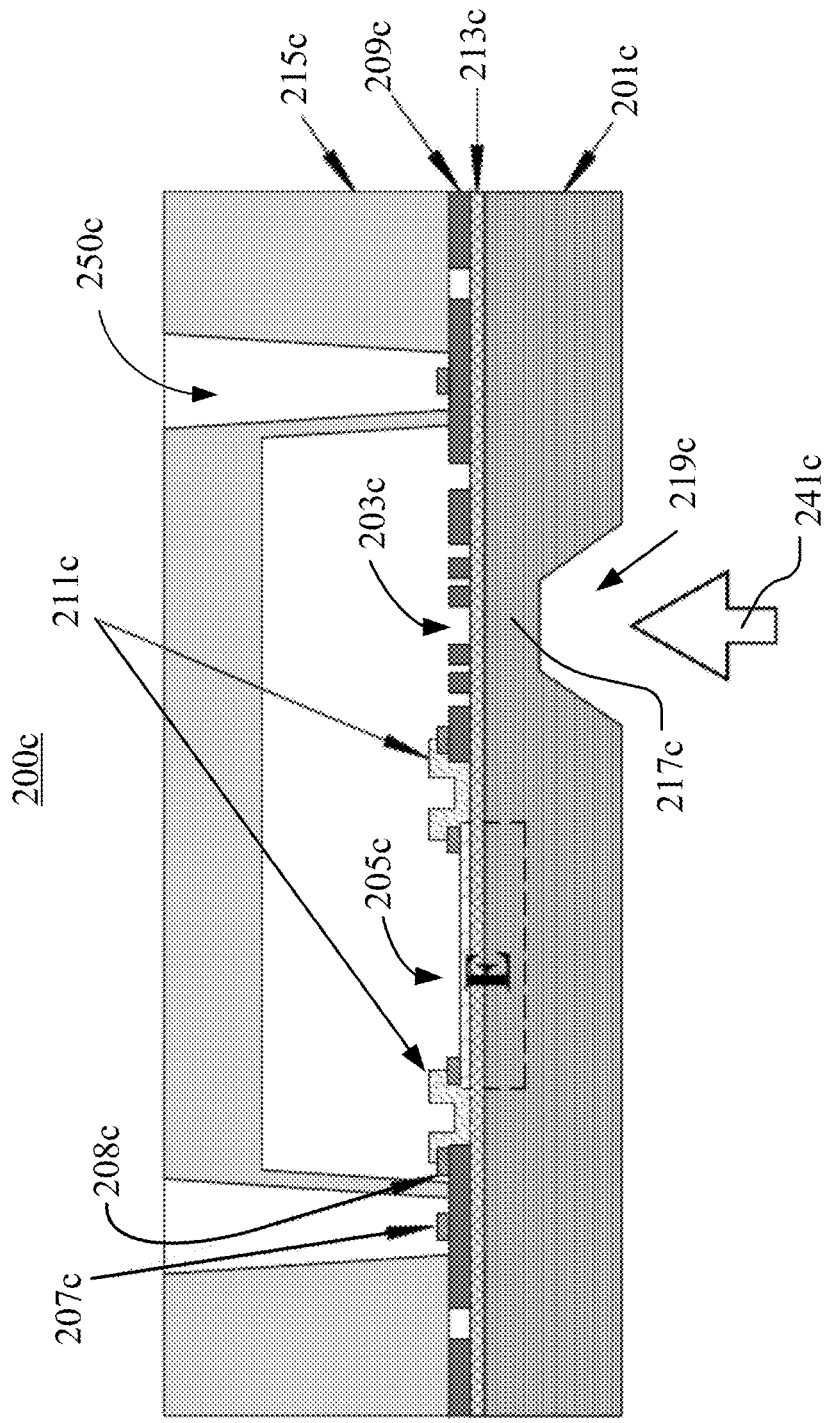

FIGS. 2A-2C depict various views of one embodiment of a semiconductor device 200a-c having a sensor 203a-c co-located with an electronic circuit 205a-c as denoted by "E" in FIGS. 2A-2C and in accordance with various aspects set forth herein. FIG. 2A is a perspective view of the semiconductor device 200a. FIG. 2B is a top view of the semiconductor device 200b. FIG. 2C is a cross-sectional side view of the semiconductor device 200c. In FIGS. 2A-2C, the semiconductor device 200a-c may be configured to include a first semiconductor substrate 201a-c, the sensor 203a-c, the electronic circuit 205a-c, contacts 207a-c, contact regions and/or pads 209a-c, interconnections 211a-c, a dielectric layer 213a-c and a cover 215c. In certain example embodiments, the cover 215c may be referred to as a contact glass. A semiconductor substrate may also be referred to as a wafer. The semiconductor device 200a-c may be leadless. The sensor 203a-c may be fabricated on the first semiconductor substrate 201a-c. In addition, the electronic circuit 205a-c may be fabricated on the first semiconductor substrate 201a-c. The first semiconductor substrate 201a-c may be a patterned SOI wafer.

In FIGS. 2A-2C, the sensor 203a-c may be configured to include a sensing element 218a-b, a diaphragm 217c and an aperture 219c. In one example, the sensing element 218a-b may be a piezoresistive network such as a Wheatstone bridge with the resistance of each piezoresistor varying in proportion to an environmental condition 241c such as force or pressure applied at the aperture 219c to the diaphragm 217c of the sensor 203a-c. In one example implementation, the sensing element 218a-b may be disposed on a front surface of the first semiconductor substrate 201a-c. In an example implementation, the diaphragm 217c may be disposed on the semiconductor substrate 201a-c and adjacent to the sensing element 218a-b. In another example implementation, the diaphragm 217c may be disposed on the semiconductor substrate 201a-c and co-aligned with the sensing element 218a-b. For example, FIG. 2C depicts the diaphragm 217c co-aligned with the sensing element 218a-b. The sensing element 218a-b may be fabricated on the first semiconductor substrate 201a-c using conventional wafer processing techniques, which may provide dielectrically isolated piezoresistors. A person of ordinary skill in the art will recognize various techniques for designing and fabricating sensors.

In certain example embodiments, the electronic circuit 205a-c may be a signal conditioning and/or compensating electronic circuit such as described in FIG. 1. In one example, the electronic circuit 205a-c may be used to provide a regulated voltage to the sensing element 218a-b. In another example, the electronic circuit 205a-c may be used to modify an amplitude of the environmental condition signal output by the sensing element 218a-b. In another example, the electronic circuit 205a-c may be used to filter the environmental condition signal output by the sensing element 218a-b. In another example, the electronic circuit (such as the electronic circuit 205a-c) may be used to compensate for environmental conditions such as temperature. In one example implementation, the electronic circuit 205a-c may be fabricated on the front surface of the first semiconductor substrate 201a-c. Further, the electronic circuit 205a-c may be fabricated contemporaneously with the sensing element 218a-b. In an example implementation, the electronic circuit 205a-c may be fabricated on a back surface of the first semiconductor substrate 201a-c. For example, in one example implementation, the electronic circuit 205a-c may be diffused or otherwise fabricated onto the diaphragm 217c. A person of ordinary skill in the art will recognize various techniques for designing and fabricating signal conditioning electronic circuits for use with sensors. In one example, the semiconductor device 200a-c may be fabricated in accordance with a leadless packaging framework as described in U.S. Pat. No. 5,955,771, entitled "SENSORS FOR USE IN HIGH VIBRATIONAL APPLICATIONS AND METHODS FOR FABRICATING SAME," issued Sep. 21, 1999 to A. D. Kurtz et al. and assigned to Kulite Semiconductor Products, Inc., the assignee herein.

In certain example implementations, the contact areas and/or pads 209a-c, may project from a surface of the first semiconductor substrate 201a-c. In accordance with an example implementation, the contact pads 209a-c may be composed of highly doped silicon such as highly doped p+ silicon. The contacts 207a-c may be disposed on the contact pads 209a-c. In one example, the contacts 207a-c may be metal contacts. Further, the contacts 207a-c, the contact pads 209a-c, and the interconnections 211a-c may be added using wafer-level processing or micro-fabrication techniques. A person of ordinary skill in the art will recognize various techniques for wafer-level processing and micro-fabrication. The dielectric layer 213a-c may be used to isolate the sensing element 218a-b and the electronic circuit 205a-c from the first semiconductor substrate 201a-c. In one example, the dielectric layer 213a-c may be composed of silicon dioxide.

In FIGS. 2A-2C, the aperture 219c may be fabricated at the back surface of the first semiconductor substrate 201c to form the diaphragm 217c that may be coupled to the sensor 203c via the semiconductor substrate 201c. The aperture 219c may allow an environmental condition 241c such as a force or a pressure to be applied to the diaphragm 217c. The deflection of the diaphragm 217c by the environmental condition 241c may induce a stress on the diaphragm 217c (for example, the diaphragm region of the semiconductor substrate 201c)

which may cause the resistance of each piezoresistor of the sensing element 218a-b to change. The aperture 219c may be shaped to form the diaphragm 217c by using, for instance, etching techniques. A person of ordinary skill in the art will recognize various techniques for etching a semiconductor. In one example, the aperture 219c and the diaphragm 217c may be formed as described in U.S. Pat. No. 4,236,137, entitled "SEMICONDUCTOR TRANSDUCERS EMPLOYING FLEXURE FRAMES," issued Nov. 25, 1980 to A. D. Kurtz et al. and assigned to Kulite Semiconductor Products Inc., the assignee herein.

In certain embodiments, a thickness of the diaphragm 217c may determine its stiffness. Further, a position of the sensing element 218a-b with respect to the diaphragm 217c may be associated with a form factor of the diaphragm 217c. An area associated with a diaphragm of a sensor may also be referred to as an active area. An area of a sensor not associated with an active area may be referred to as a non-active area.

Once the sensing element 218a-b and the electronic circuit 205a-c are fabricated such as in accordance with the leadless packaging framework as described in the aforementioned U.S. Pat. No. 4,236,137, an appropriately designed cover may be used to hermetically seal the sensing element 218a-b and the electronic circuit 205a-c. The cover 215c (also known as contact glass) may be used to hermetically seal the sensing element 218a-b and the electronic circuit 205a-c by, for instance, electrostatically bonding the cover 215c to the contact pads 209a-c of the semiconductor device 200a-c. In one example, the cover 215c may be composed of borosilicate glass. The cover 215c may be configured to include apertures 250c, which may provide external access for electrical connections to the metal contacts 207a-c for example, via header pins as will be subsequently described.

FIG. 2C further depicts interconnect contacts 208c on certain pads 209a-c of the device 200a-c, for example, that may provide electrical connection to the interconnects 211a-c. In certain example implementations, these interconnect contacts 208c may be positioned so that the cover 215c may be used to hermetically seal the interconnect contacts 208c, the sensing element 218a-b, and the electronic circuit 205a-c within an enclosed region while allowing header pins to contact the metal contacts 207a-c.

Certain example implementation of the sensor assembly may include a semiconductor device and a header assembly. The header assembly onto which a semiconductor device is mounted may contain a plurality of header pins protruding above a mounting surface of a header glass. In certain example implementations, the header glass may be made from a glass material. In other example implementations, the header glass may be made from a ceramic material. Thus, the term "header glass" herein may refer to a header made with either glass or ceramic. The header pins may be intended to extend into the apertures 250c in a cover of the semiconductor device. The hermetically sealed semiconductor device may then undergo an appropriate filling of contact pads with conductive material in preparation for subsequent mounting onto the header glass. The semiconductor device may then be mounted using non-conductive mounting material, while electrical connections may be made using the conductive material that is filled inside the coaxial apertures 250c in the cover. The conductive and non-conductive mounting materials may be designed to be thermally matched with the electronic circuit, the sensing element and the header assembly to allow simultaneous mounting and electrical interconnection of the semiconductor device. The selection of the mounting material may dictate temperature compatibility of the sensor assembly. An unanticipated advantage of this approach is that the sensing element may be in compression during the sensing operation, which may be preferred for high-pressure applications.

Figures 3A, 3B:
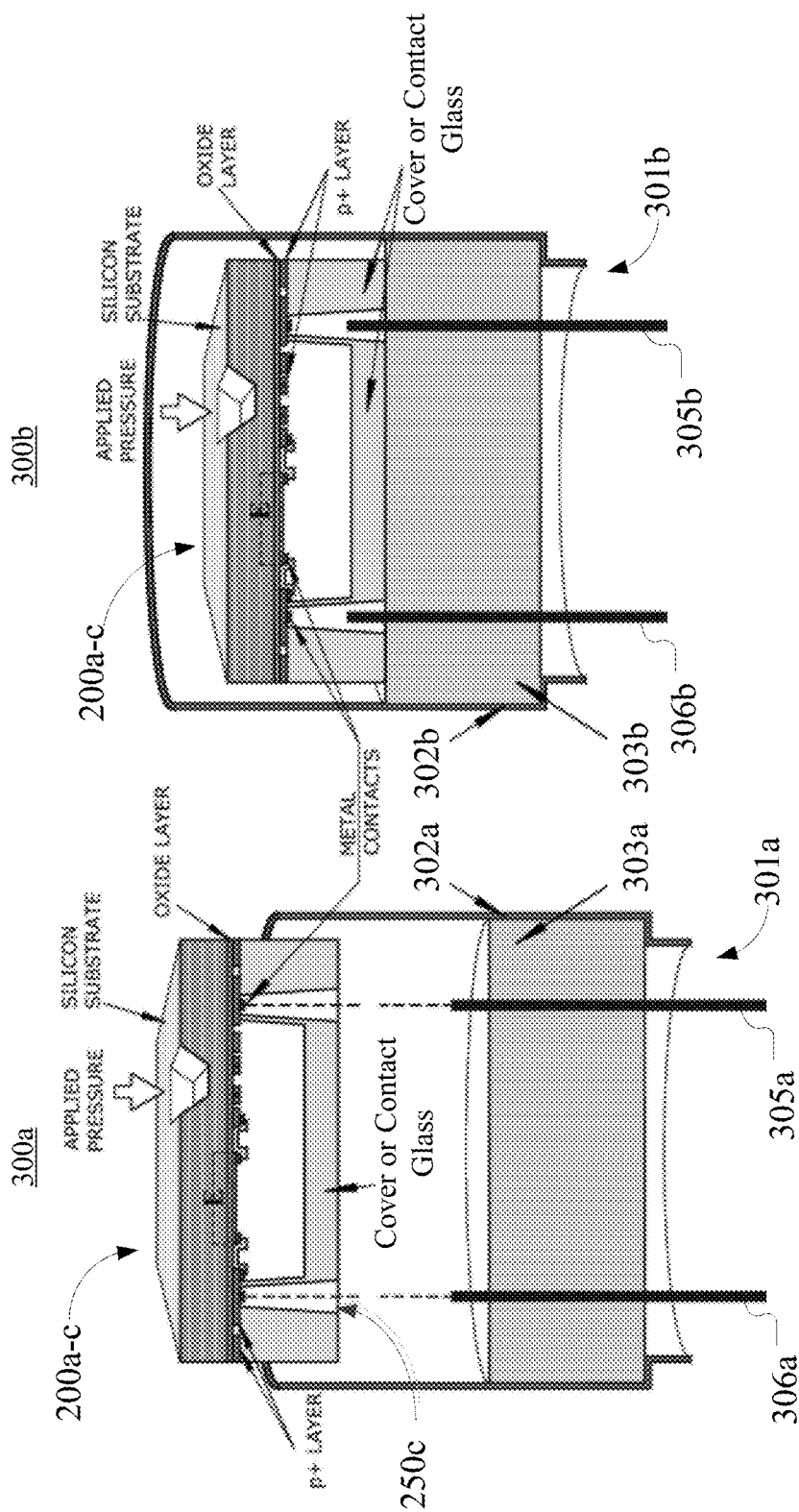
FIGS. 3A-3B are various cross-sectional side views of one embodiment of a sensor assembly having the semiconductor device of FIGS. 2A-2C in accordance with various aspects set forth herein.

FIGS. 3A and 3B depict various cross-sectional side views of one embodiment of a sensor assembly 300a-b that may utilize the semiconductor device 200a-c of FIGS. 2A-2C in accordance with various aspects set forth herein. For example, FIG. 3A depicts an unassembled cross-sectional side view of the sensor assembly 300a. FIG. 3B depicts an assembled cross-sectional side view of the sensor assembly 300b. In FIGS. 3A and 3B, the sensor assembly 300a-b may be configured to include the semiconductor device 200a-c and a header assembly 301a-b. The header assembly 301a-b may be configured to include a header shell 302a-b, a header glass 303a-b and a first set of header pins 305a-b and 306a-b. In one example implementation, the header glass 303a-b may be made from glass. In another example implementation, the header glass 303a-b may be made from ceramic. The header shell 302a-b may be configured to include a flange at a bottom portion thereof. The header glass 303a-b may be seated on the flange and may be hermetically bonded or sealed to the inner surface or the flange of the header shell 302a-b. The header glass 303a-b may be disposed around and may define coaxial apertures therein. The first set of header pins 305a-b and 306a-b may be inserted into each aperture of the header glass 303a-b. After insertion, a top portion of each header pin 305a-b and 306a-b may extend beyond a front surface of the header glass 303a-b. Similarly, a bottom portion of each header pin 305a-b and 306a-b may extend beyond a back surface of the header glass 303a-b. The first set of header pins 305a-b and 306a-b may be hermetically bonded or sealed within the apertures of the header glass 303a-b forming, for instance, a conductive seal between the header pins 305a-b and 306a-b and the metal contacts (such as metal contacts 207a-c shown in FIGS. 2A-2C) and metal-to-glass seals within at least a portion of the coaxial apertures 250c.

In FIGS. 3A and 3B, a spacing of the first set of header pins 305a-b and 306a-b of the header assembly 301a-b may correspond to a spacing of the apertures 250c of the cover 215c of the semiconductor device 200a-c such that the semiconductor device 200a-c may be mounted onto the header glass 303a-b with the first set of header pins 305a-b and 306a-b positioned through the apertures of the cover 215c to couple with the contacts 207a-c of the semiconductor device 200a-c. In one example implementation, and prior to mounting, the semiconductor device 200a-c may have conductive mounting material disposed in the apertures of the cover 215c thereof in preparation for electrically and mechanically coupling the contacts 207a-c of the semiconductor device 200a-c to the first set of header pins 305a-b and 306a-b of the header assembly 301a-b. In one example, the conductive mounting material may be glass-metal frit. The cover 215c of the semiconductor device 200a-c may be mounted to the header glass 303a-b using non-conductive mounting material. In one example, the non-conductive mounting material may be a glass frit. Further, the first set of header pins 305a-b and 306a-b of the header assembly may be electrically coupled to the contacts 207a-c of the semiconductor device 200a-c using the conductive mounting material placed in the apertures of the cover 215c thereof.

Furthermore, the conductive mounting material and the non-conductive mounting material may be thermally compatible with the semiconductor device 200a-c and the header glass 303a-b to provide contemporaneous mounting and electrical coupling of the devices such as at a certain temperature range during fabrication. The selection of the conductive mounting material and the non-conductive mounting material may affect a temperature range of operation of the sensor assembly 300a-b. An unanticipated advantage of this configuration is that the sensor 203a-c may be in compression during the sensing operation, which may be advantageous for high-pressure applications. A person of ordinary skill in the art will recognize various techniques for packaging a semiconductor device.

In a case where a sensing network and an electronic circuit may not be fabricated on the same chip, a sensor may be fabricated on a first semiconductor substrate such as described in the aforementioned U.S. Pat. No. 5,955,771. The first semiconductor substrate may be geometrically redesigned or reconfigured to allow space for a second semiconductor substrate having the electronic circuit, indicated by "E" in the figures, to be mounted on a front surface of the first semiconductor substrate at a specific location. The second semiconductor substrate may be mounted on the first semiconductor substrate using an epoxy, ceramic, glass, or other such material. Interconnections between the sensing element on the first semiconductor substrate, the electronic circuit on the second semiconductor substrate, and the contacts of the third semiconductor substrate may use wire bonding or other interconnection techniques. Subsequent to completing the interconnections, a separately fabricated cover may be electrostatically bonded to the third semiconductor substrate, contemporaneously hermetically sealing the sensing element and the electronic circuit. The semiconductor device may then undergo filling of the contact pads with conductive materials in preparation for subsequent mounting onto a header assembly to form a sensor assembly.

Figure 4A:
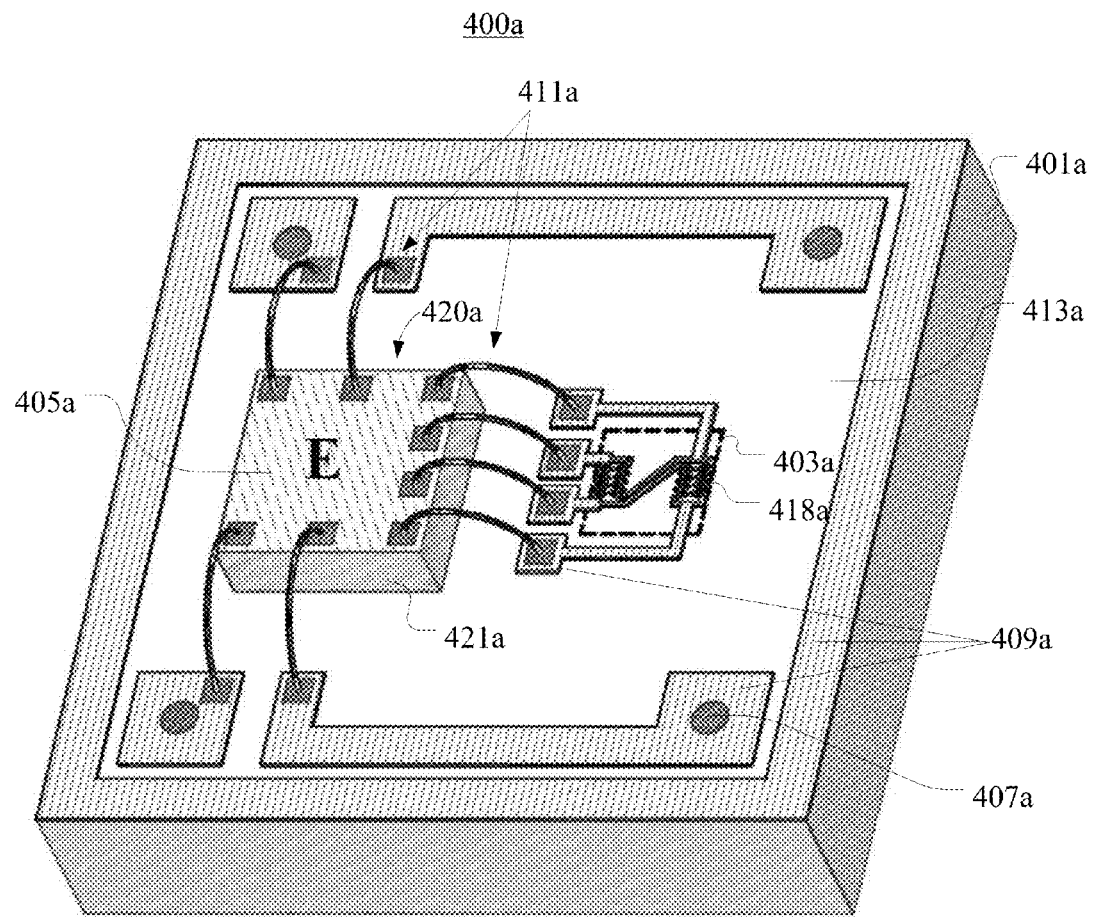
FIGS. 4A-4C are various views of another embodiment of a semiconductor device having a sensor co-located with an electronic circuit in accordance with various aspects set forth herein.
Figure 4B:
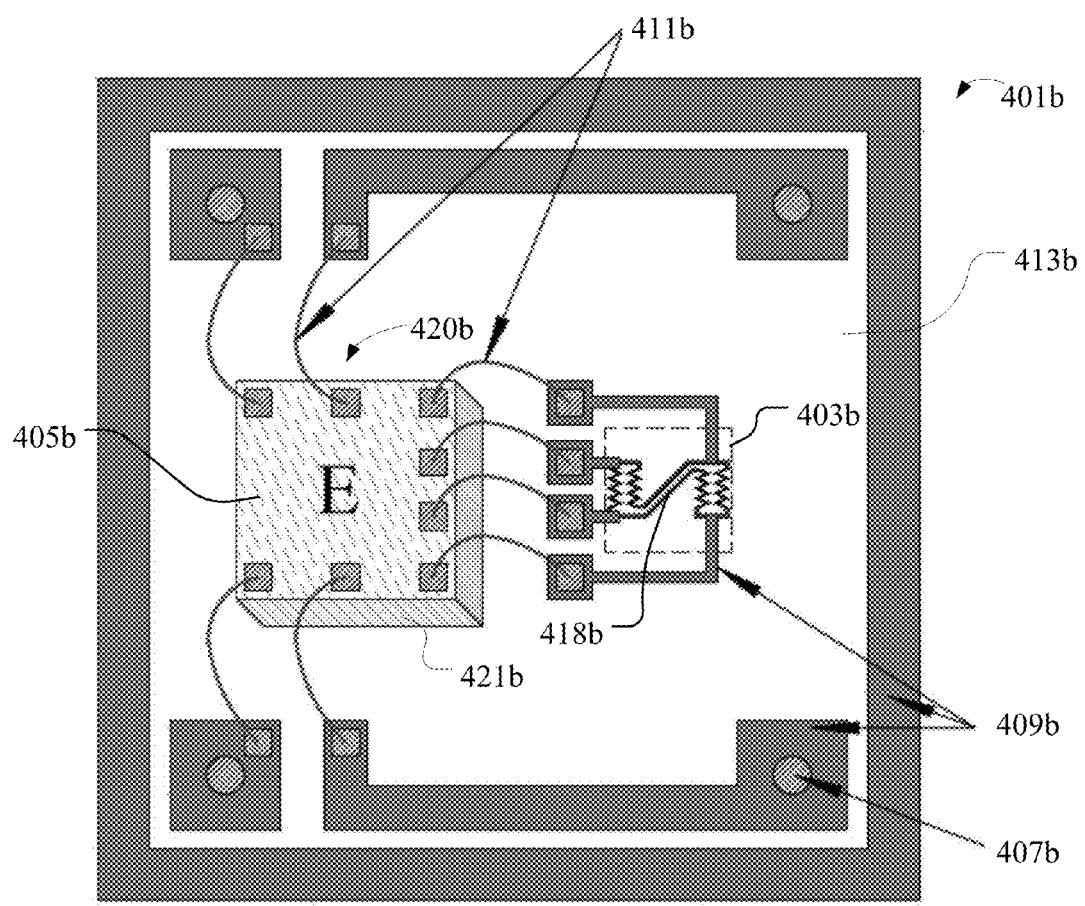
Figure 4C:
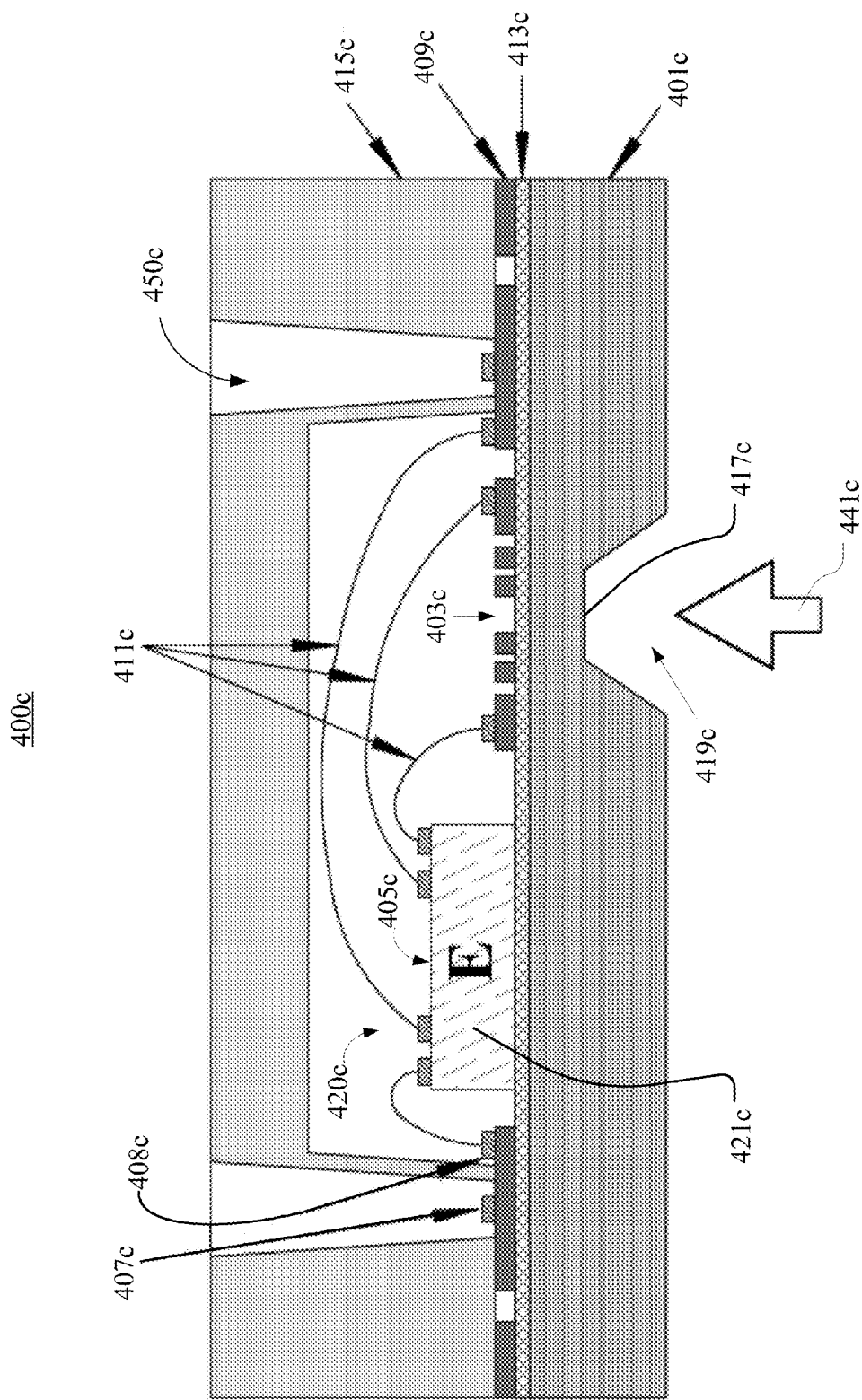

FIGS. 4A-4C depict various views of one embodiment of a semiconductor device 400a-c having a sensor 403a-c co-located with an electronic circuit 405a-c in accordance with various aspects set forth herein. FIG. 4A is a perspective view of the semiconductor device 400a. FIG. 4B is a top view of the semiconductor device 400b. FIG. 4C is a cross-sectional side view of the semiconductor device 400c. In FIGS. 4A-4C, the semiconductor device 400a-c may be configured to include a first semiconductor substrate 401a-c, the sensor 403a-c, contacts 407a-c, contact pads 409a-c, a dielectric layer 413a-c, a cover 415c, an electronic circuit assembly 420a-c and electrical interconnections 411a-c. The semiconductor device 400a-c may be leadless. According to certain example embodiments of the disclosed technology, the cover 415c may be referred to as a contact glass.

In FIGS. 4A-4C, the sensor 403a-c may be fabricated on the first semiconductor substrate 401a-c. The first semiconductor substrate 401a-c may be a patterned SOI wafer. The electronic circuit assembly 420a-c may be configured to include the electronic circuit 405a-c and a second semiconductor substrate 421a-c. However, the electronic circuit 405a-c, in this example implementation, may be fabricated on a second semiconductor substrate 421a-c using any conventional fabrication process for integrated circuits such as bipolar, complementary metal oxide semiconductor (CMOS), bipolar CMOS (BiCMOS), silicon germanium BiCMOS (SiGE BiCMOS), gallium arsenide (GaAs), SOI, or the like. The first semiconductor substrate 401a-c may be geometrically redesigned or reconfigured to allow space for mounting the electronic circuit semiconductor device 420a-c on the front surface thereof. The electronic circuit semiconductor device 420a-c may be mechanically coupled or attached to the front surface of the first semiconductor substrate 401a-c, for example, using an epoxy, a ceramic material, glass, or the like.

As discussed above, the sensor 403a-c may be configured to include a sensing element 418a-b, a diaphragm 417c and an aperture 419c. The sensing element 418a-b may be disposed on the front surface of the first semiconductor substrate 401a-c. The region that defines a diaphragm 417c may be disposed on a back surface of the first semiconductor substrate 401a-c. Further, the region that defines a diaphragm 417c may be opposite the sensing element 418a-b. In certain example implementations, the region that defines the diaphragm 417c may be a recessed portion disposed on a back surface of the first semiconductor substrate 401a-c. In certain example implementations, the region that defines the diaphragm 417c may be disposed on a back surface of the first semiconductor substrate 401a-c opposite the sensing element 418a-b. The contacts 407a-c may be disposed on the contact pads 409a-c. Further, the contacts 407a-c and the contact pads 409a-c may be added using wafer-level processing or micro-fabrication techniques. The dielectric layer 413a-c may be used to isolate the sensing element 418a-b and the electronic circuit semiconductor device 420a-c from the first semiconductor substrate 401a-c. After mounting the electronic circuit semiconductor device 420a-c to the front surface of the first semiconductor substrate 401a-c, the electronic circuit 405a-c may be electrically coupled to the sensing element 418a-b and the contacts 407a-c using the interconnections 411a-c such as wire bonds.

In this embodiment, the aperture 419c may be fabricated at the back surface of the first semiconductor substrate 401a-c to form the diaphragm 417c of the sensor 403a-c. The aperture 419c may allow an environmental condition 441c such as a force or a pressure to be applied to the diaphragm 417c. The deflection of the diaphragm 417c by the environmental condition 441c may induce a stress on the diaphragm 417c, which may cause the resistance of each piezoresistor of the sensing element 418a-b to change. The aperture 419c may be shaped to form the diaphragm 417c by using, for instance, etching techniques.

After processing the interconnections 411a-c between the electronic circuit semiconductor device 420a-c and the sensing element 418a-b and between the electronic circuit semiconductor device 420a-c and the contacts 407a-c, the cover 415c (also known as a cover glass) may be used to hermetically seal the sensing element 418a-b and the electronic circuit semiconductor device 420a-c by, for instance, electrostatically bonding the cover 415c to the contact pads 409a-c of the semiconductor device 400a-c. The cover 415c may be configured to include apertures 450c, which may provide access for electrical connections to the metal contacts 407a-c of the semiconductor device 400a-c, for example, via header pins.

FIG. 4C further depicts interconnect contacts 408c on certain pads 409a-c of the device 400a-c, for example, that may provide electrical connection to the interconnections 411a-c. In certain example implementations, these interconnect contacts 408c may be positioned so that the cover 415c may be used to hermetically seal the interconnect contacts 408c, the sensing element 418a-b, and the electronic circuit 405a-c within an enclosed region while allowing header pins to contact the metal contacts 407a-c.

Figures 5A, 5B:
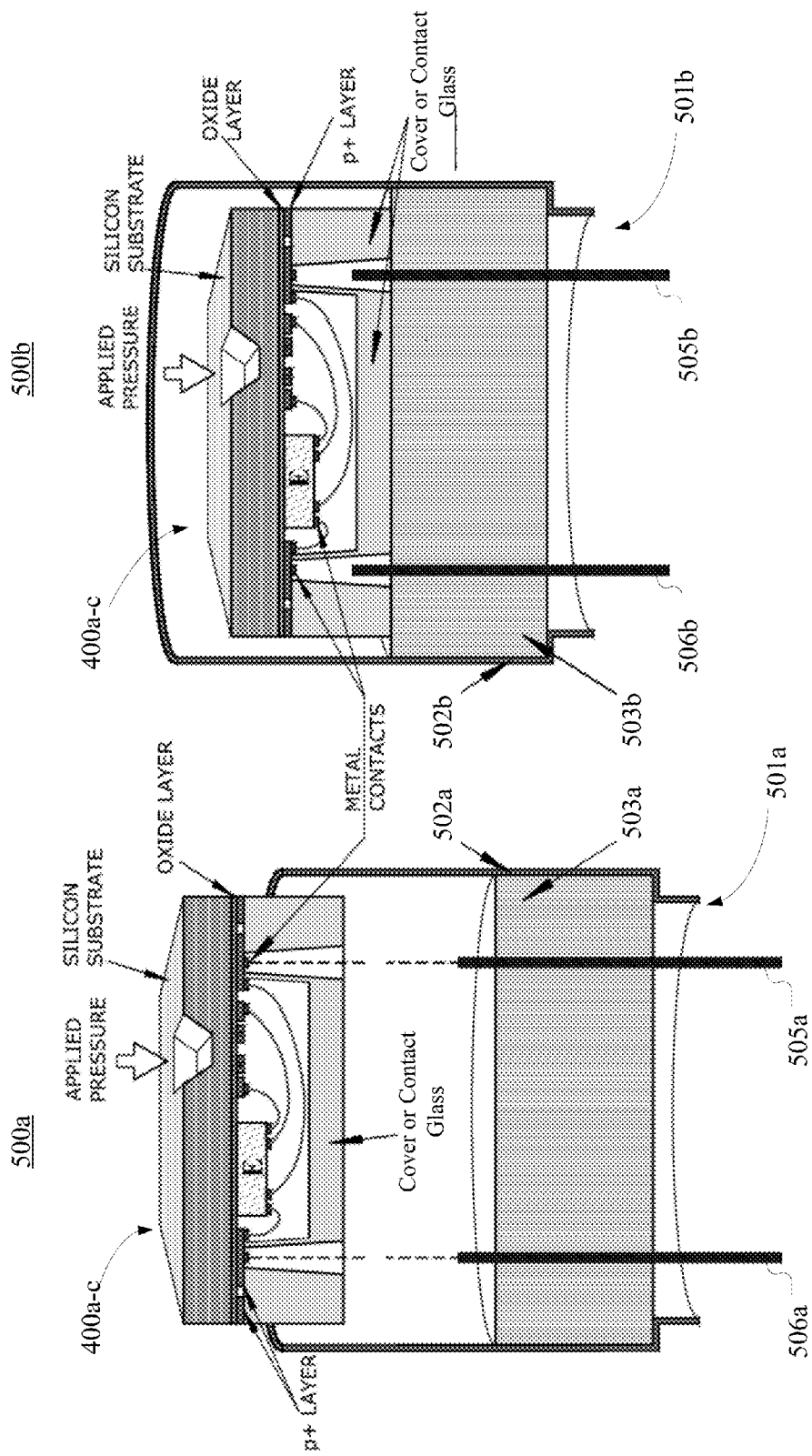
FIGS. 5A-5B are various cross-sectional side views of another embodiment of a sensor assembly having the semiconductor device of FIGS. 4A-4C in accordance with various aspects set forth herein.

FIGS. 5A and 5B are various cross-sectional side views of another embodiment of a sensor assembly 500a-b including the semiconductor device 400a-c of FIGS. 4A-4C in accordance with various aspects set forth herein. As previously described above with reference to FIG. 3A and FIG. 3B, FIG. 5A depicts an unassembled cross-sectional side view of the sensor assembly 500a, while FIG. 5B depicts an assembled cross-sectional side view of the sensor assembly 500b. In FIGS. 5A and 5B, the sensor assembly 500a-b may be configured to include the semiconductor device 400a-c and a header assembly 501*a-b*. The header assembly 501*a-b* may be configured to include a header shell 502*a-b*, a header glass 503*a-b* and a first set of header pins 505*a-b* and 506*a-b*. The header shell 502*a-b* may be configured to include a flange at a bottom portion thereof. The header glass 503*a-b* may be seated on the flange and may be hermetically bonded or sealed to the inner surface or the flange of the header shell 502*a-b*. The header glass 503*a-b* may be disposed around and may define coaxial apertures therein. The first set of header pins 505*a-b* and 506*a-b* may be inserted into each aperture of the header glass 503*a-b*. After insertion, a top portion of each header pin 505*a-b* and 506*a-b* may extend beyond a front surface of the header glass 503*a-b*. Similarly, a bottom portion of each header pin 505*a-b* and 506*a-b* may extend beyond a back surface of the header glass 503*a-b*. The first set of header pins 505*a-b* and 506*a-b* may be hermetically bonded or sealed within the apertures of the header glass 503*a-b* forming, for instance, a conductive seal between the header pins 305*a-b* and 306*a-b* and the metal contacts (such as metal contacts 407*a-c* shown in FIGS. 4A-4C) and metal-to-glass seals within at least a portion of the coaxial apertures 450*c*.

In FIGS. 5A and 5B, a spacing of the first set of header pins 505*a-b* and 506*a-b* of the header assembly may correspond to a spacing of the apertures of the cover 415*c* of the semiconductor device 400*a-c* such that the semiconductor device 400*a-c* may be mounted onto the header glass 503*a-b* with the first set of header pins 505*a-b* and 506*a-b* positioned through the apertures of the cover 415*c* to couple with the contacts 407*a-c* of the semiconductor device 400*a-c*. Prior to mounting, the semiconductor device 400*a-c* may have conductive mounting material disposed in the apertures of the cover 415*c* thereof in preparation for electrically and/or mechanically coupling the contacts 407*a-c* of the semiconductor device 400*a-c* to the first set of header pins 505*a-b* and 506*a-b* of the header assembly. The cover 415*c* of the semiconductor device 400*a-c* may be mounted to the header glass 503*a-b* using non-conductive mounting material. Further, the first set of header pins 505*a-b* and 506*a-b* of the header assembly may be electrically and/or mechanically coupled to the contacts 407*a-c* of the semiconductor device 400*a-c* using the conductive mounting material placed in the apertures of the cover 415*c* thereof.

Alternatively, a semiconductor device may include a first semiconductor substrate having a sensor and a second semiconductor substrate having an electronic circuit. The first semiconductor substrate and the second semiconductor substrate may be mounted onto a third semiconductor substrate, which may be designed and fabricated on an SOI substrate wafer including an aperture for sensing media. The third semiconductor substrate may be configured to host the first semiconductor substrate having the sensor and the second semiconductor substrate having the electronic circuit. Further, the third semiconductor substrate may be configured to include the aperture and a contact area such as a p+ region to allow for subsequent electrostatic bonding of a cover. The first semiconductor substrate having the sensor may be mounted over the aperture of the third semiconductor device, while the second semiconductor substrate having the electronic circuit may be mounted nearby. Interconnections between the sensing element on the first semiconductor substrate, the electronic circuit on the second semiconductor substrate, and the contacts of the third semiconductor substrate may use wire bonding or other interconnection techniques. Subsequent to completing the interconnections, a separately fabricated cover may be electrostatically bonded to the third semiconductor substrate, contemporaneously hermetically sealing the sensing element and the electronic circuit. The semiconductor device may then undergo filling of the contact pads with conductive materials in preparation for subsequent mounting onto a header assembly to form a sensor assembly.

Figure 6A:
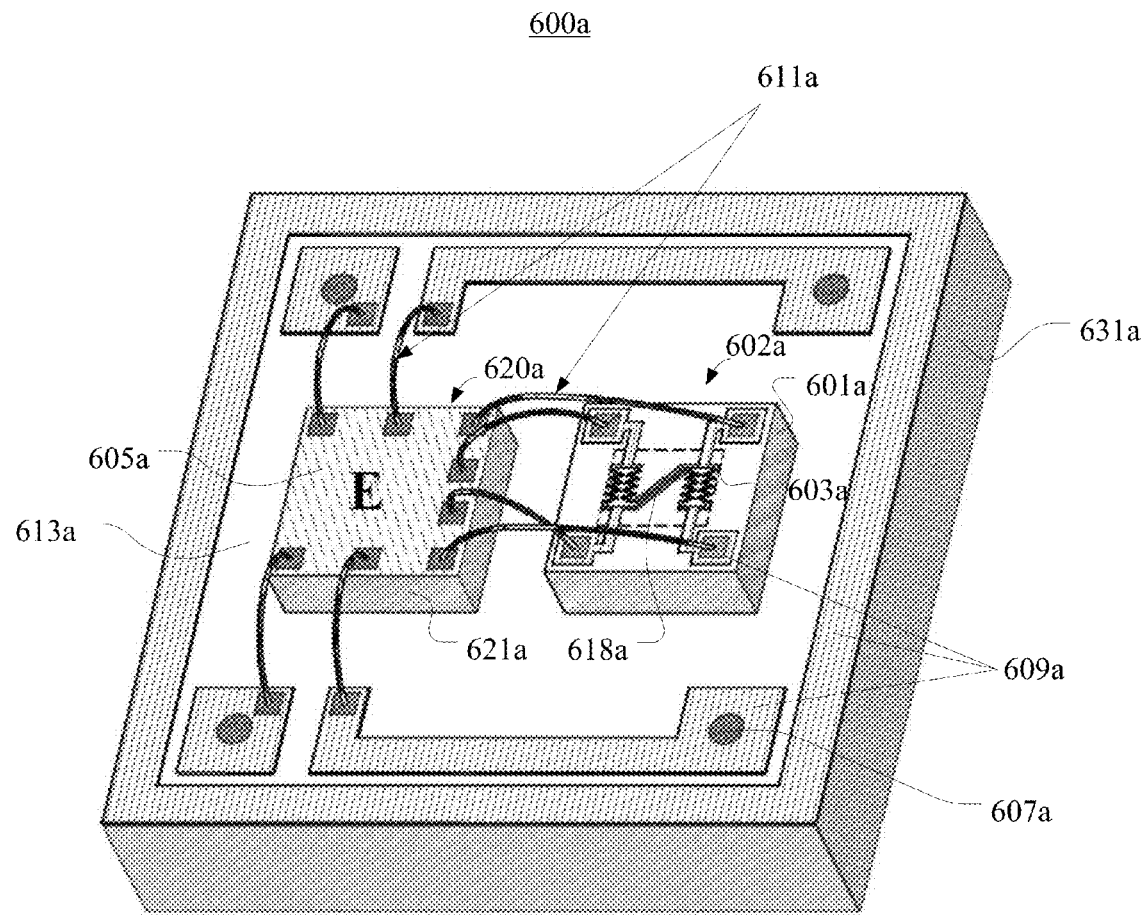
FIGS. 6A-6C are various views of another embodiment of a semiconductor device having a sensor co-located with an electronic circuit in accordance with various aspects set forth herein.
Figure 6B:
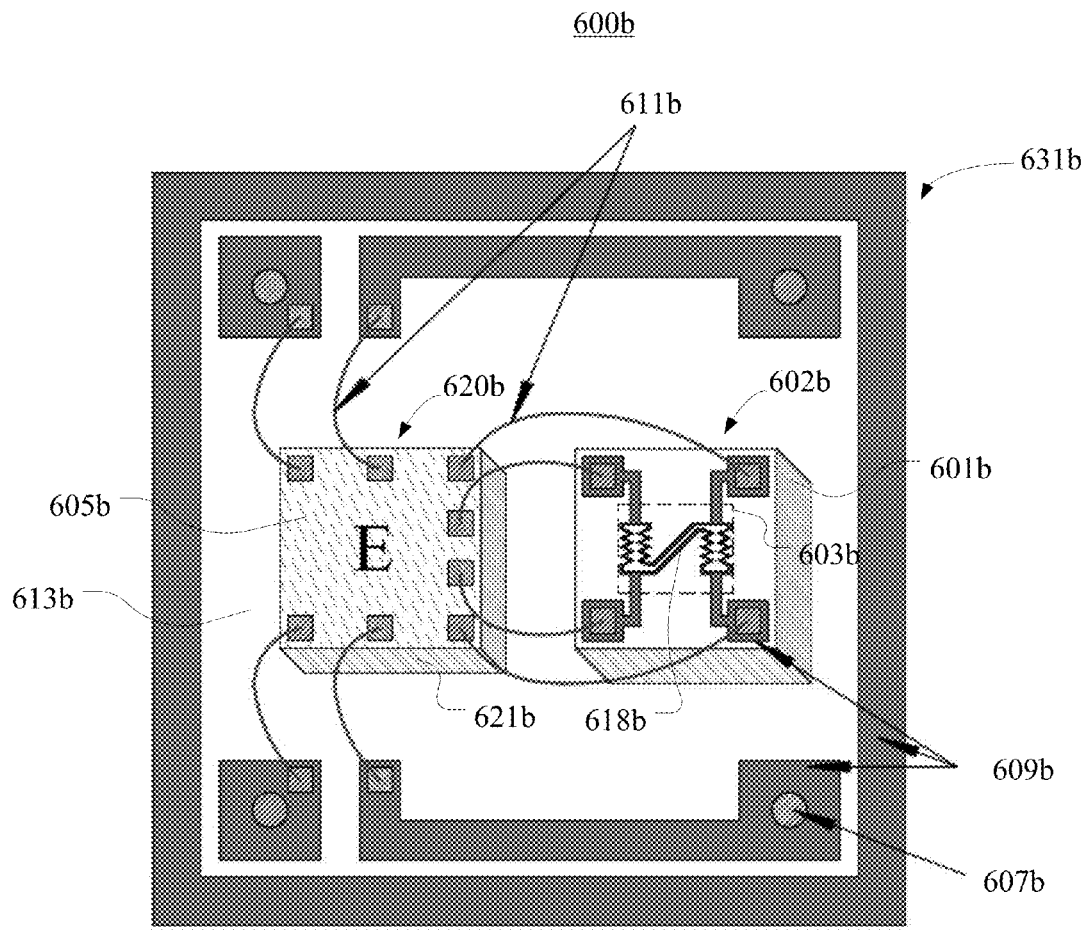
Figure 6C:
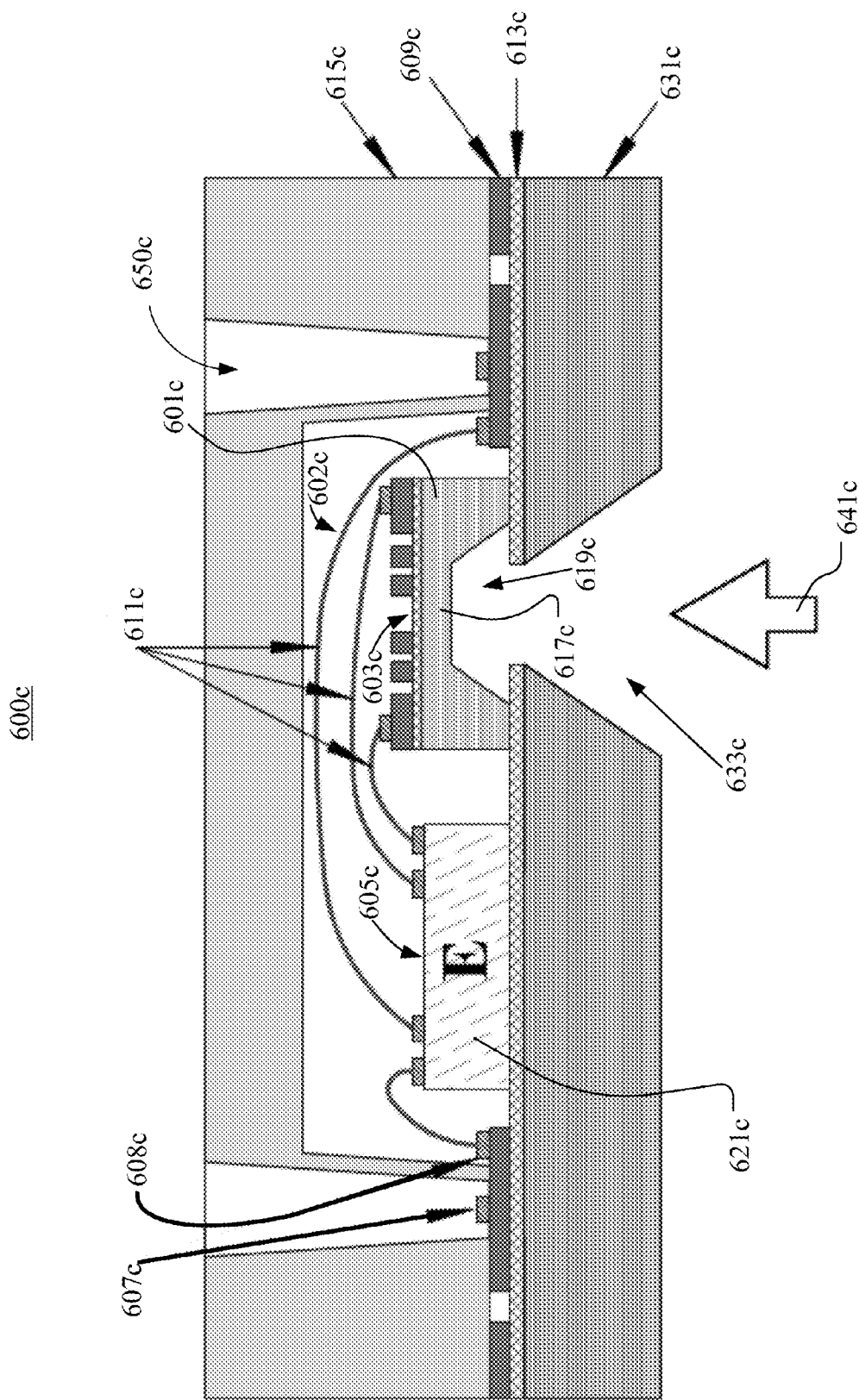

For example, FIGS. 6A-6C are various views of one embodiment of a semiconductor device 600*a-c* having a sensor 603*a-c* co-located with an electronic circuit 605*a-c* in accordance with various aspects set forth herein. FIG. 6A is a perspective view of the semiconductor device 600*a*. FIG. 6B is a top view of the semiconductor device 600*b*. FIG. 6C is a cross-sectional side view of the semiconductor device 600*c*. In FIGS. 6A-6C, the semiconductor device 600*a-c* may be configured to include a first semiconductor substrate 601*a-c* having the sensor 603*a-c*, a second semiconductor substrate 621*a-c* having the electronic circuit 605*a-c*, a third semiconductor substrate 631*a-c* and a cover 615*c*. According to certain example embodiments of the disclosed technology, the cover 615*c* may be referred to as a contact glass. Also, the semiconductor device 600*a-c* may be leadless. The first semiconductor substrate 601*a-c* and the second semiconductor substrate 621*a-c* may be mechanically coupled to a front surface of the third semiconductor substrate 631*a-c*. The first semiconductor substrate 601*a-c* may be mechanically coupled to the front surface of the third semiconductor substrate 631*a-c* using an epoxy, a ceramic material, glass, or the like. Similarly, the second semiconductor substrate 621*a-c* may be mechanically coupled to the front surface of the third semiconductor substrate 631*a-c* using an epoxy, a ceramic material, glass, or the like. The sensor 603*a-c* may be fabricated on the first semiconductor substrate 601*a-c*. The first semiconductor substrate 601*a-c* may be a patterned SOI wafer. The electronic circuit 605*a-c* may be fabricated on the second semiconductor substrate 621*a-c* using any conventional fabrication process for integrated circuits. The third semiconductor substrate 631*a-c* may be prepared using any conventional fabrication process for integrated circuits such as for a patterned SOI wafer.

In FIGS. 6A-6C, the sensor 603*a-c* may be configured to include a diaphragm 617*c*, a sensing element 618*a-b* and a first aperture 619*c*. The sensing element 618*a-b* may be disposed on a front surface of the first semiconductor substrate 601*a-c*. The region that defines a diaphragm 617*c* may be disposed on a back surface of the first semiconductor substrate 601*a-c*. Further, the region that defines a diaphragm 617*c* may be opposite the sensing element 618*a-b*. The first aperture 619*c* may be fabricated at the back surface of the first semiconductor substrate 601*a-c* to form the diaphragm 617*c* of the sensor 603*a-c*. The third semiconductor substrate 631*a-c* may be disposed around and may define a second aperture 633*c*. The first semiconductor substrate 601*a-c* may be mounted to the third semiconductor substrate 631*a-c* such that the second aperture 633*c* may be mechanically coupled to the diaphragm 617*c* using the first aperture 619*c*. The first aperture 619*c* may allow an environmental condition 641*c* such as a force or a pressure to be applied to the diaphragm 617*c*. The deflection of the diaphragm 617*c* by the environmental condition 641*c* may induce a stress on the diaphragm 617*c*, which may cause the resistance of each piezoresistor of the sensing element 618*a-b* to change. The first aperture 619*c* may be shaped to form the diaphragm 617*c* by using, for instance, etching techniques.

Furthermore, the third semiconductor substrate 631*a-c* may be configured to include contacts 607*a-c*, contact pads 609*a-c*, interconnections 611*a-c*, a dielectric layer 613*a-c* and the second aperture 633*c*. The contacts 607*a-c* may be disposed on the contact pads 609*a-c*. Further, the contacts 607a-c and the contact pads 609a-c may be added using wafer-level processing or micro-fabrication techniques. The dielectric layer 613a-c may be used to isolate the first semiconductor substrate 601a-c and the second semiconductor substrate 601a-c from the third semiconductor substrate 601a-c. After mounting the first semiconductor substrate 601a-c and the second semiconductor substrate 621a-c to the third semiconductor substrate 631a-c, the electronic circuit 605a-c may be electrically coupled to the sensing element 618a-b and the contacts 607a-c using the interconnections 611a-c such as a wire bond.

In an example implementation, the cover 615c may be used to hermetically seal the sensing element 618a-b and the electronic circuit 605a-c by, for instance, electrostatically bonding the cover 615c to the contact pads 609a-c of the third semiconductor substrate 631a-c. According to certain example embodiments of the disclosed technology, the cover 615c may be referred to as a contact glass. The cover 615c may be configured to include apertures 650c, which may provide access for electrical connections to the metal contacts 607a-c of the semiconductor device 600a-c, for example, via header pins.

FIG. 6C further depicts interconnect contacts 608c on certain pads 609a-c of the device 600a-c, for example, that may provide electrical connection to the interconnections 611a-c. In certain example implementations, these interconnect contacts 608c may be positioned so that the cover 615c may be used to hermetically seal the interconnect contacts 608c, the associated sensing element 618a-b, and the electronic circuit 605a-c within an enclosed region while allowing header pins to contact the metal contacts 607a-c.

Figures 7A, 7B:
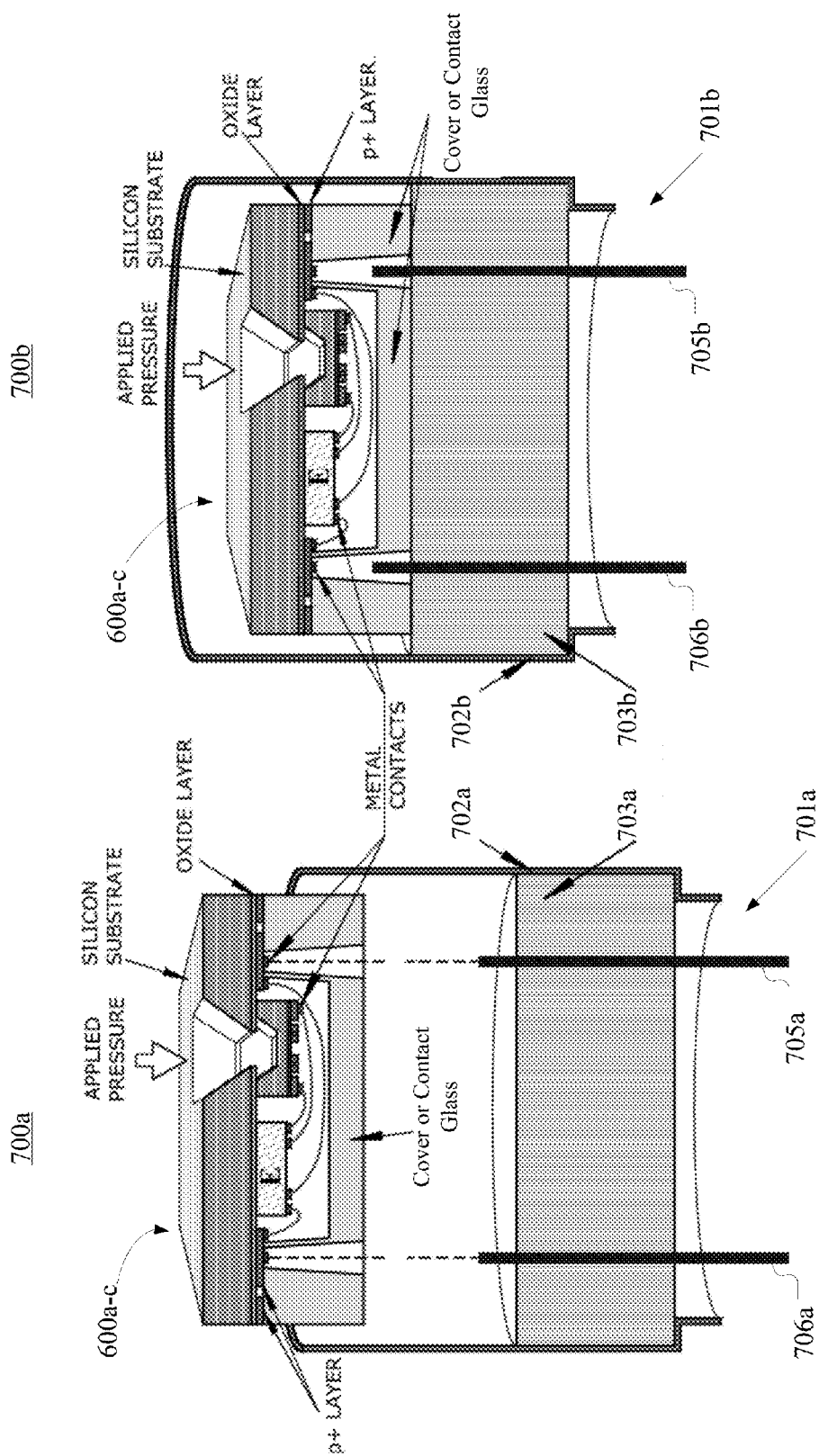
FIGS. 7A-7B are various cross-sectional side views of another embodiment of a sensor assembly having the semiconductor device of FIGS. 6A-6C in accordance with various aspects set forth herein.

FIGS. 7A and 7B are various cross-sectional side views of one embodiment of a sensor assembly 700a-b having the semiconductor device 600a-c of FIGS. 6A-6C in accordance with various aspects set forth herein. FIG. 7A is an unassembled cross-sectional side view of the sensor assembly 700a. FIG. 7B is an assembled cross-sectional side view of the sensor assembly 700b. In FIGS. 7A and 7B, the sensor assembly 700a-b may be configured to include the semiconductor device 600a-c of FIGS. 6A-6C and a header assembly 701a-b. The header assembly 701a-b may be configured to include a header shell 702a-b, a header glass 703a-b and a first set of header pins 705a-b and 706a-b. The header shell 702a-b may be configured to include a flange at a bottom portion thereof. The header glass 703a-b may be seated on the flange and may be hermetically bonded or sealed to the inner surface or the flange of the header shell 702a-b. The header glass 703a-b may be disposed around and may define coaxial apertures therein. The first set of header pins 705a-b and 706a-b may be inserted into each aperture of the header glass 703a-b. After insertion, a top portion of each header pin 705a-b and 706a-b may extend beyond a front surface of the header glass 703a-b. Similarly, a bottom portion of each header pin 705a-b and 706a-b may extend beyond a back surface of the header glass 703a-b. The first set of header pins 705a-b and 706a-b may be hermetically bonded or sealed within the apertures of the header glass 703a-b forming, for instance, a glass-to-metal seal.

In FIGS. 7A and 7B, a spacing of the first set of header pins 705a-b and 706a-b of the header assembly 701a-b may correspond to a spacing of the apertures of the cover 615c of the semiconductor device 600a-c such that the semiconductor device 600a-c may be mounted onto the header glass 703a-b with the first set of header pins 705a-b and 706a-b positioned through the apertures of the cover 615c to couple with the contacts 607a-c of the semiconductor device 600a-c. Prior to mounting, the semiconductor device 600a-c may have conductive mounting material disposed in the apertures of the cover 615c thereof in preparation for electrically and mechanically coupling the contacts 607a-c of the semiconductor device 600a-c to the first set of header pins 705a-b and 706a-b of the header assembly 701a-b. The cover 615c of the semiconductor device 600a-c may be mounted to the header glass 703a-b using non-conductive mounting material. Further, the first set of header pins 705a-b and 706a-b of the header assembly 701a-b may be electrically and mechanically coupled to the contacts 607a-c of the semiconductor device 600a-c using the conductive mounting material placed in the apertures of the cover 615c thereof.

Alternatively, a first semiconductor substrate having a sensor and a second semiconductor substrate having an electronic circuit may be mounted onto separate cover components. In this approach, the first semiconductor substrate having the sensor may be electrostatically bonded to a first cover at wafer level, while the second semiconductor substrate having an electronic circuit may be electrostatically bonded to a second cover at wafer level. Subsequently, the first semiconductor substrate having the sensor and the second semiconductor substrate having the electronic circuit may be diced using, for instance, a diamond saw or other wafer cutting techniques and may then be mounted to a header assembly or a printed circuit board (PCB). In addition, the first semiconductor substrate having the sensor may be electrostatically bonded to the first cover at the chip level or the wafer level. Also, the second semiconductor substrate having the electronic circuit may be electrostatically bonded to the second cover at the chip level or the wafer level.

Figure 8A:
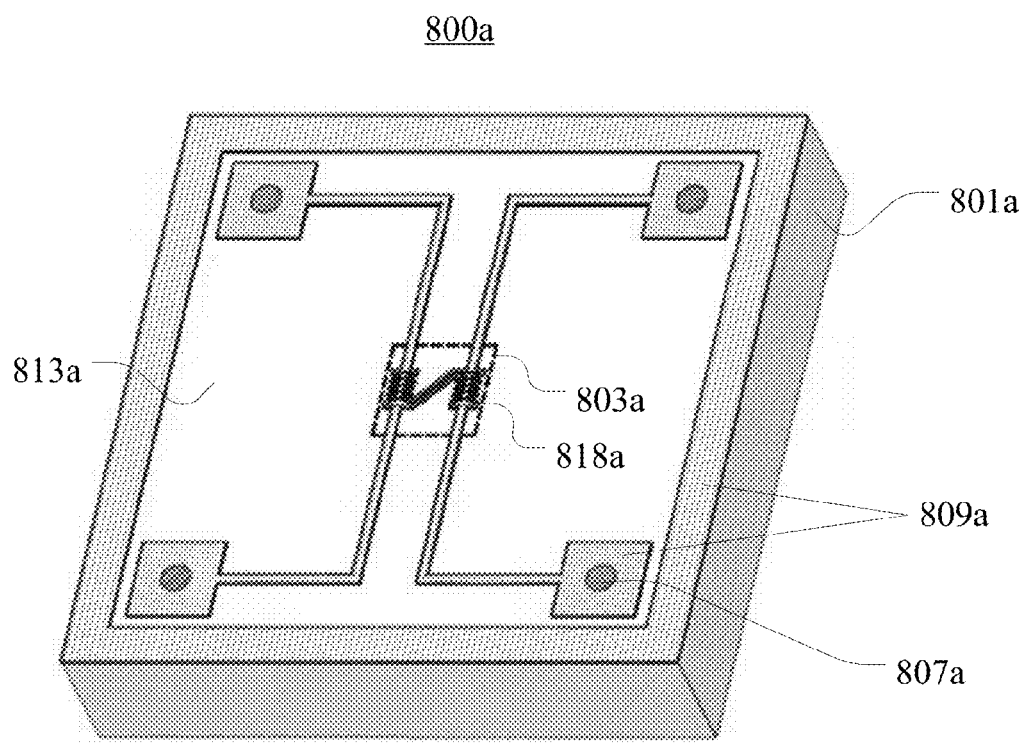
FIGS. 8A-8C are various views of one embodiment of a sensor semiconductor device in accordance with various aspects set forth herein.
Figure 8B:
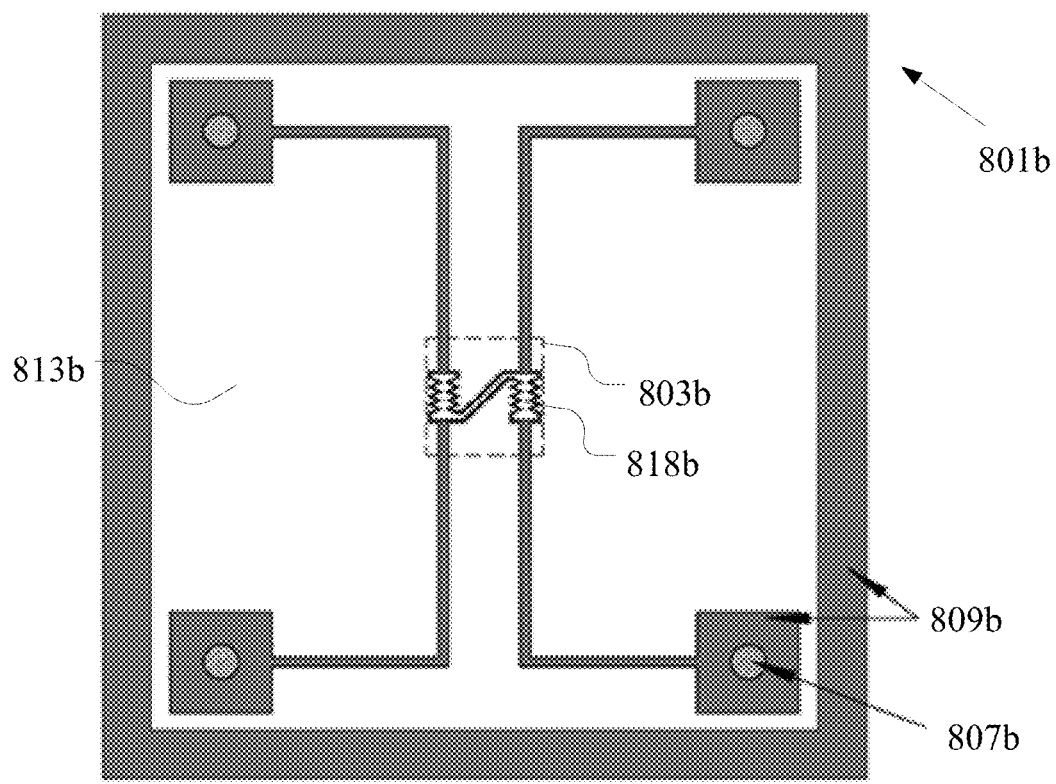
Figure 8C:
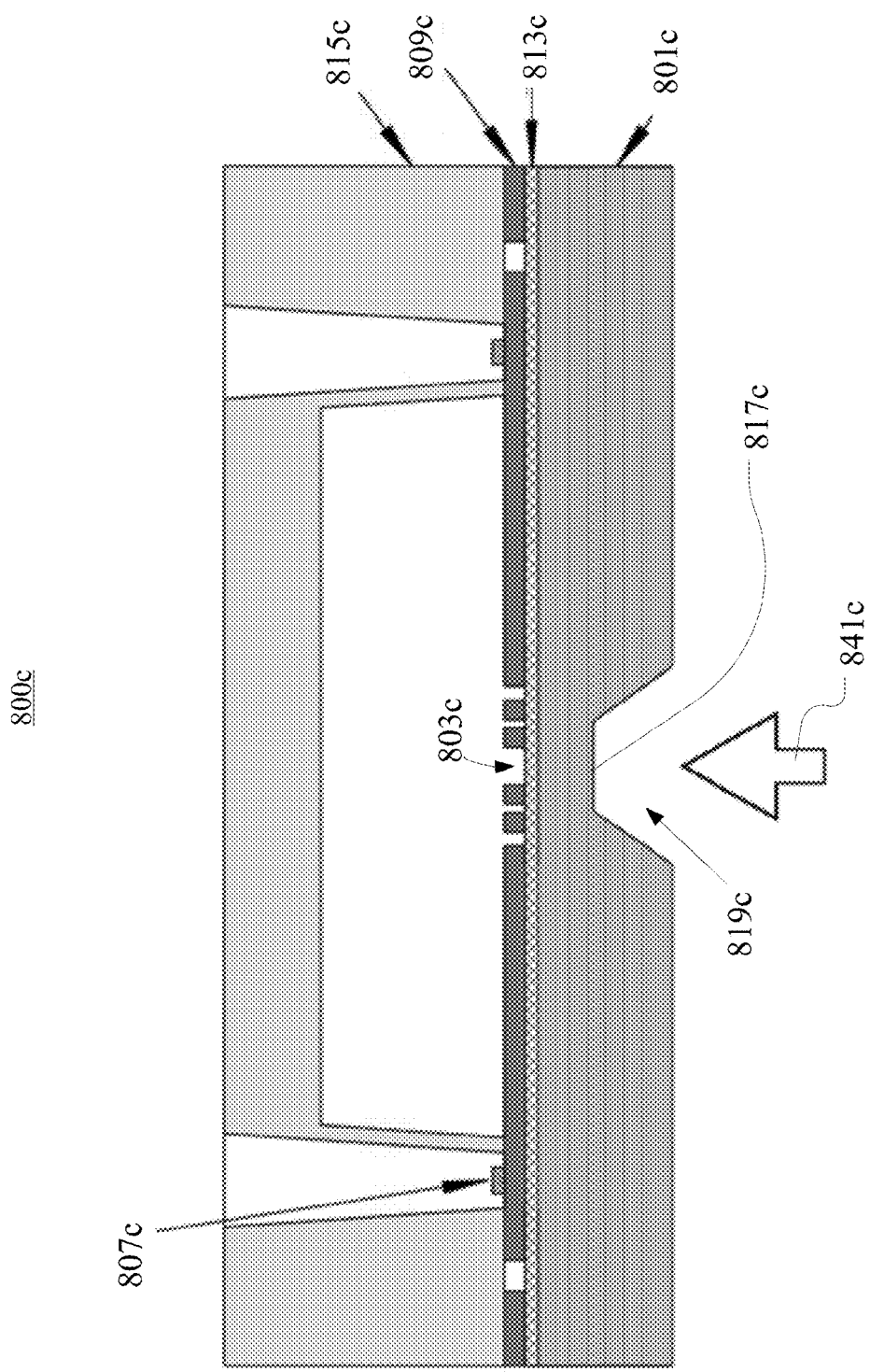

FIGS. 8A-8C are various views of one embodiment of a sensor semiconductor device 800a-c in accordance with various aspects set forth herein. FIG. 8A is a perspective view of the sensor semiconductor device 800a. FIG. 8B is a top view of the sensor semiconductor device 800b. FIG. 8C is a cross-sectional side view of the sensor semiconductor device 800c. In FIGS. 8A-8C, the sensor semiconductor device 800a-c may be configured to include a first semiconductor substrate 801a-c, a sensor 803a-c, contacts 807a-c, contact pads 809a-c, a dielectric layer 813a-c and a cover 815c. According to certain example embodiments of the disclosed technology, the cover 815c may be referred to as a contact glass. The sensor semiconductor device 800a-c may be leadless. The contacts 807a-c may be disposed on the contact pads 809a-c. Further, the contacts 807a-c and the contact pads 809a-c may be added using wafer-level processing or micro-fabrication techniques.

In FIG. 8A-C, the sensor 803a-c may be configured to include a sensing element 818a-b, a diaphragm 817c and an aperture 819c. The sensing element 818a-b may be disposed on a front surface of the first semiconductor substrate 801c. Further, the dielectric layer 813a-c may be used to isolate the sensing element 818a-b from the first semiconductor substrate 801a-c. The region that defines a diaphragm 817c may be disposed on a back surface of the first semiconductor substrate 801a-c. Further, the region that defines a diaphragm 817c may be opposite the sensing element 818a-b. The aperture 819c may be fabricated at a back surface of the semiconductor substrate 801a-c to form the diaphragm 817c of the sensor 803a-c. The aperture 819c may allow an environmental condition 841c such as a force or a pressure to be applied to the diaphragm 817c. The deflection of the diaphragm 817c by the environmental condition 841c may induce a stress on the diaphragm 817c, which may cause the resistance of each piezoresistor of the sensing element 818a-b to change. The aperture 819c may be shaped to form the diaphragm 817c by using, for instance, etching techniques. The cover 815c such as a glass cover may be used to hermetically seal the sensing element 818a-b by, for instance, electrostatically bonding the cover 815c to the contact pads 809a-c of the first semiconductor substrate 801a-c. The cover 815c may be configured to include coaxial apertures, which may overlay the metal contacts 807a-c.

Figure 9A:
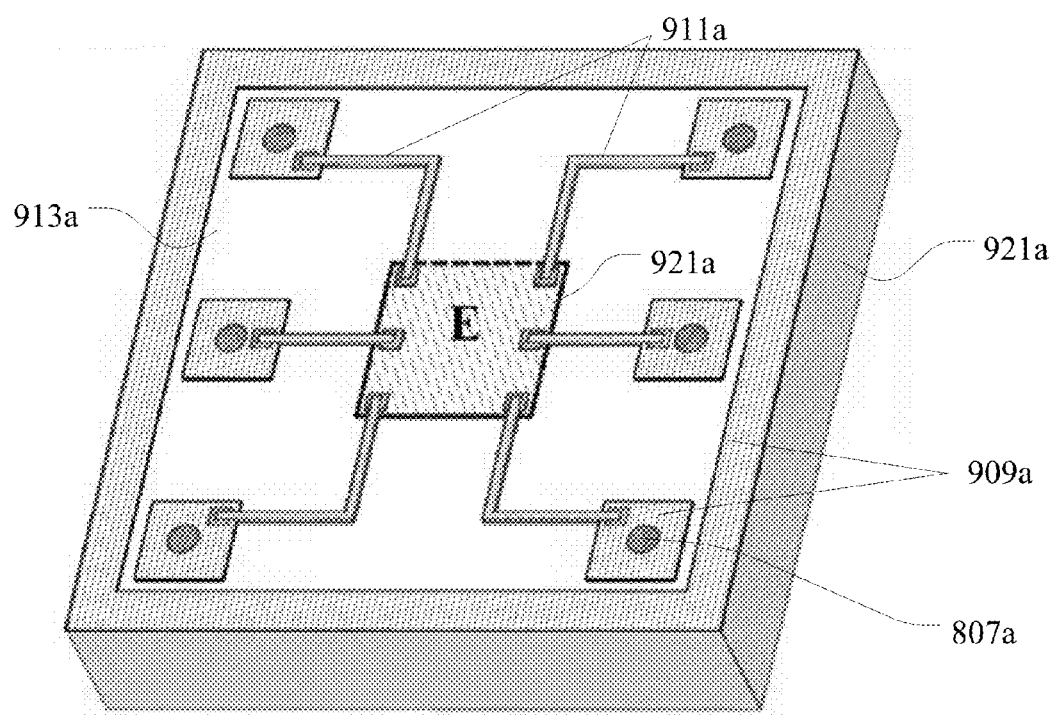
FIGS. 9A-9C are various views of one embodiment of an electronic circuit semiconductor device in accordance with various aspects set forth herein.
Figure 9B:
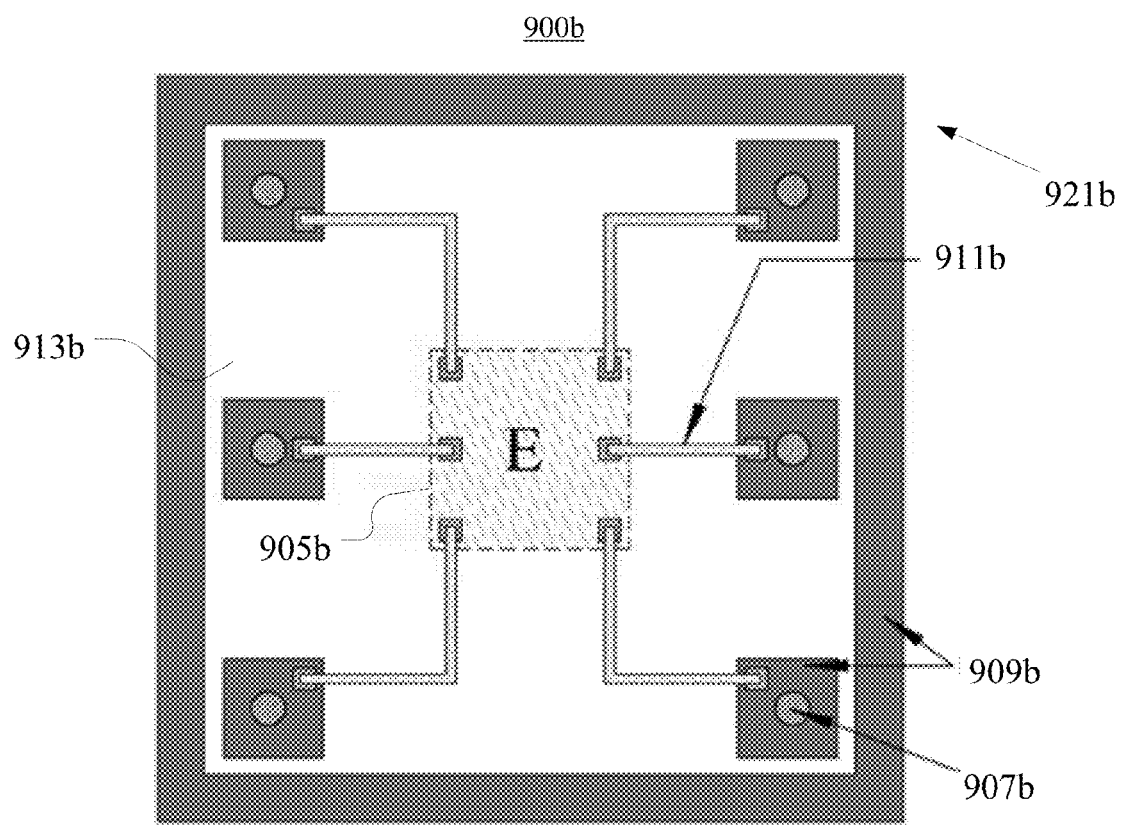
Figure 9C:
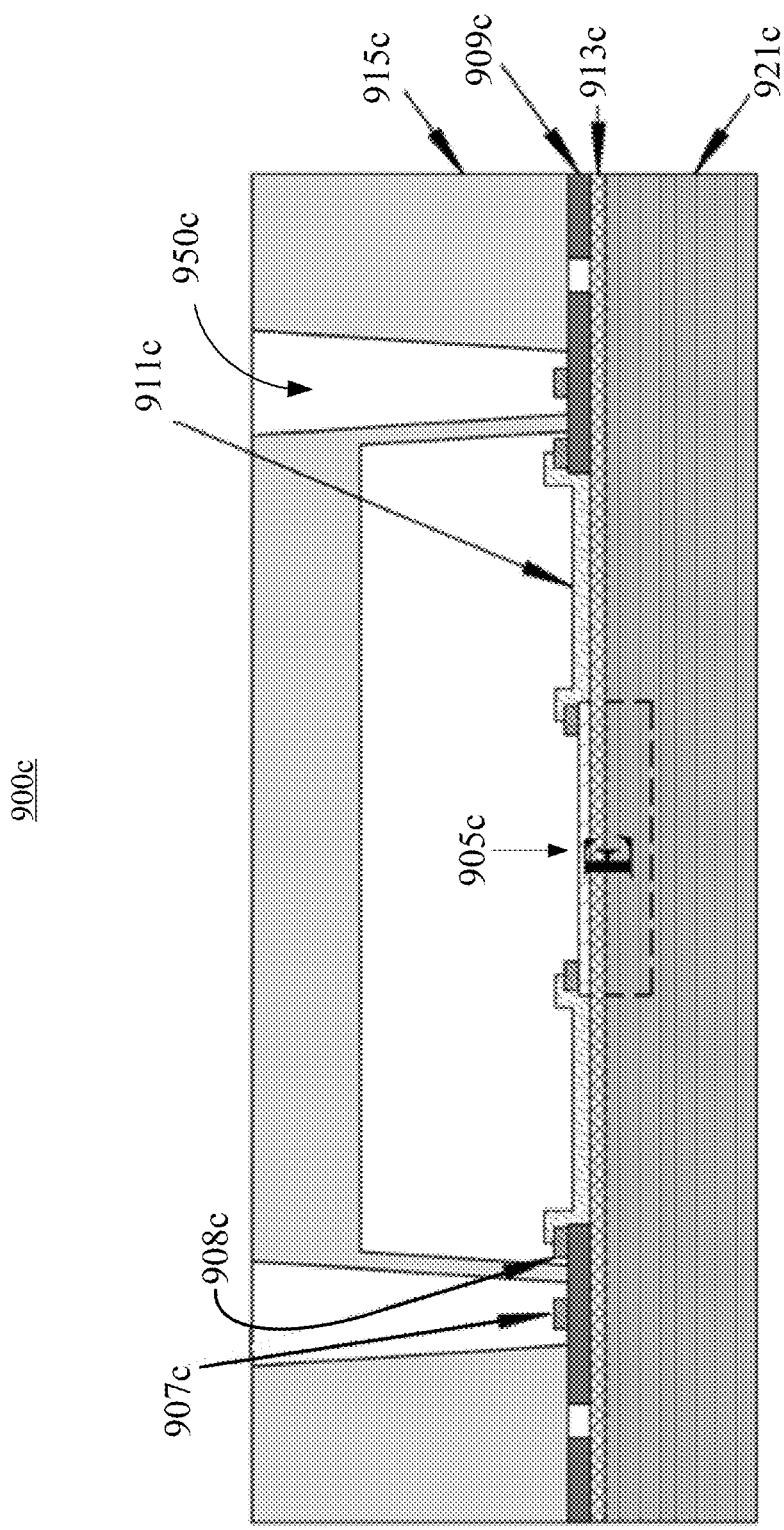

FIGS. 9A-9C are various views of one embodiment of an electronic circuit semiconductor device 900a-c in accordance with various aspects set forth herein. FIG. 9A is a perspective view of the electronic circuit semiconductor device 900a. FIG. 9B is a top view of the electronic circuit semiconductor device 900b. FIG. 9C is a cross-sectional side view of the electronic circuit semiconductor device 900c. In FIGS. 9A-9C, the electronic circuit semiconductor device 900a-c may be configured to include an electronic circuit 905a-c, contacts 907a-c, contact pads 909a-c, interconnections 911a-c, a dielectric layer 913a-c, a cover 915c, and a second semiconductor substrate 921a-c. According to certain example embodiments of the disclosed technology, the cover 915c may be referred to as a contact glass. The electronic circuit semiconductor device 900a-c may be leadless.

In FIGS. 9A-9C, the electronic circuit 905a-c may be fabricated on the second semiconductor substrate 921a-c using any conventional fabrication process for integrated circuits. The contacts 907a-c may be disposed on the contact pads 909a-c. Further, the contacts 907a-c and the contact pads 909a-c may be added using wafer-level processing or microfabrication techniques. The electronic circuit 905a-c may be electrically coupled to the contacts 907a-c using the interconnections 911a-c. The dielectric layer 913a-c may be used to isolate the electronic circuit 905a-c from the second semiconductor substrate 921a-c. The cover 915c may be used to hermetically seal the electronic circuit 905a-c by, for instance, electrostatically bonding the cover 915c to the contact pads 909a-c of the second semiconductor substrate 921a-c. The cover 915c may be configured to include apertures 950c, which may provide access for electrical connections to the metal contacts 907a-c of the semiconductor device, for example, via header pins.

FIG. 9C further depicts interconnect contacts 908c on certain pads 909a-c of the device 900a-c, for example, that may provide electrical connection to the interconnections 911a-c. In certain example implementations, these interconnect contacts 908c may be positioned so that the cover 915c may be used to hermetically seal the interconnect contacts 908c and the electronic circuit 905a-c within an enclosed region while allowing header pins to contact the metal contacts 907a-c.

Figures 10A, 10B:
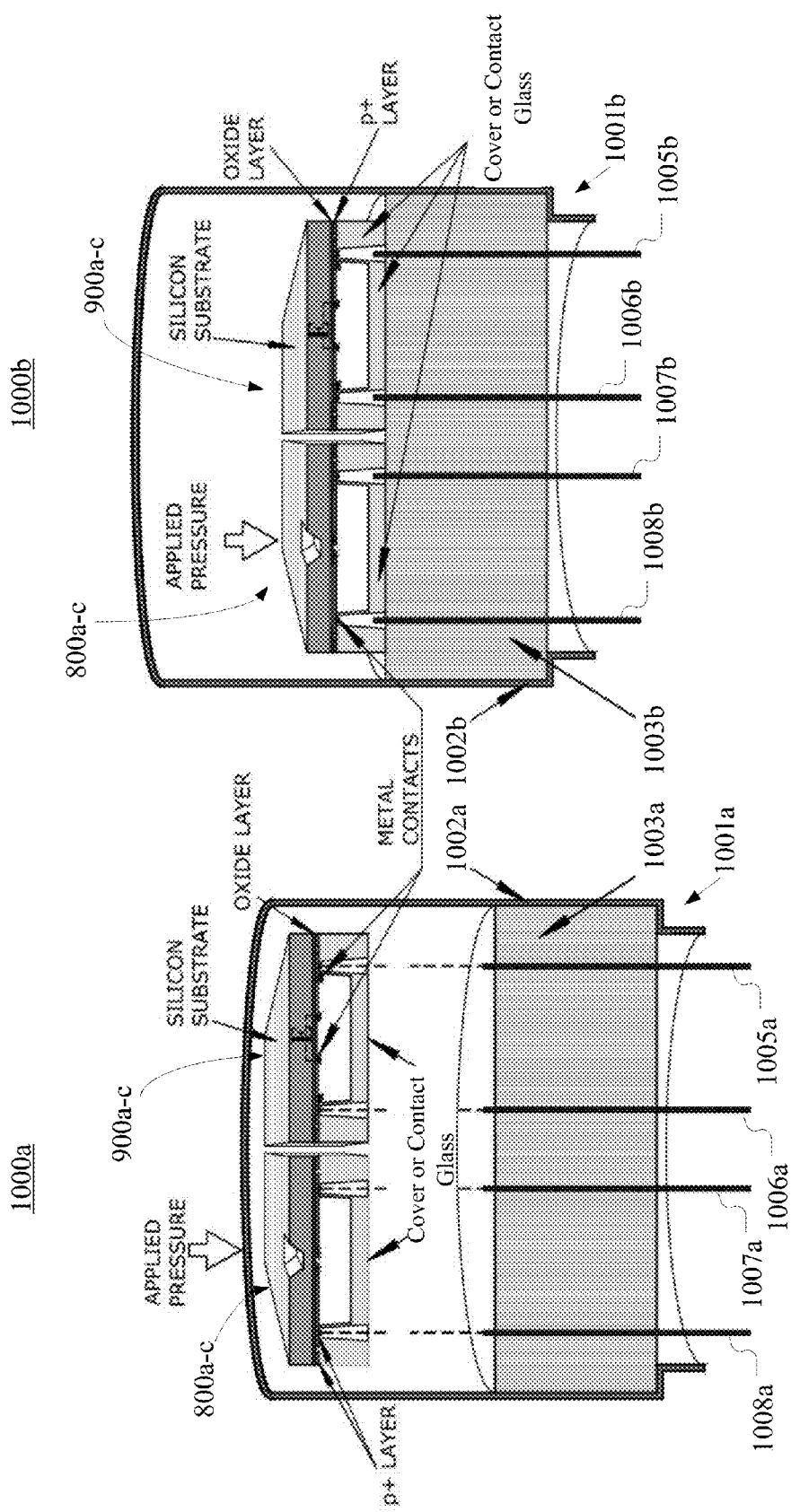
FIGS. 10A-10B are various cross-sectional side views of another embodiment of a sensor assembly having the sensor semiconductor device of FIGS. 8A-8C co-located with the electronic circuit semiconductor device of FIGS. 9A-9C in accordance with various aspects set forth herein.

FIGS. 10A-10B are various cross-sectional side views of another embodiment of a sensor assembly 1000a-b having the sensor semiconductor device 800a-c of FIGS. 8A-8C and the electronic circuit semiconductor device 900a-c of FIGS. 9A-9C in accordance with various aspects set forth herein. FIG. 10A is an unassembled cross-sectional side view of the sensor assembly 1000a. FIG. 10B is an assembled cross-sectional side view of the sensor assembly 1000b. In FIGS. 10A and 10B, the sensor assembly 1000a-b may be configured to include the sensor semiconductor device 800a-c of FIGS. 8A-8C, the electronic circuit semiconductor device 900a-c of FIGS. 9A-9C and a header assembly 1001a-b.

In FIGS. 10A and 10B, the header assembly 1001a-b may be configured to include a header shell 1002a-b, a header glass 1003a-b, a first set of header pins 1005a-b and 1006a-b and a second set of header pins 1007a-b and 1008a-b. The header shell 1002a-b may be configured to include a flange at a bottom portion thereof. The header glass 1003a-b may be seated on the flange and may be hermetically bonded or sealed to the inner surface or the flange of the header shell 1002a-b. The header glass 1003a-b may be disposed around and may define coaxial apertures therein. The first set of header pins 1005a-b and 1006a-b and the second set of header pins 1007a-b and 1008a-b may be inserted into each aperture of the header glass 1003a-b. After insertion, a top portion of each header pin 1005a-b to 1008a-b may extend beyond a front surface of the header glass 1003a-b. Similarly, a bottom portion of each header pin 1005a-b to 1008a-b may extend beyond a back surface of the header glass 1003a-b. The header pins 1005a-b to 1008a-b may be hermetically bonded or sealed within the apertures of the header glass 1003a-b forming, for instance, a glass-to-metal seal.

In FIGS. 10A and 10B, a spacing of the first set of header pins 1005a-b and 1006a-b of the header assembly 1001a-b may correspond to a spacing of the apertures of the cover 915c of the electronic circuit semiconductor device 900a-c such that it may be mounted onto the header glass 1003a-b with the first set of header pins 1005a-b and 1006a-b positioned through the apertures of the cover 915c to electrically couple with the contacts 907a-c of the electronic circuit semiconductor device 900a-c. Similarly, a spacing of the second set of header pins 1007a-b and 1008a-b of the header assembly 1001a-b may correspond to a spacing of the apertures of the cover 815c of the sensor semiconductor device 800a-c such that it may be mounted onto the header glass 1003a-b with the second set of header pins 1007a-b and 1008a-b positioned through the apertures of the cover 815c to electrically couple with the contacts 807a-c of the sensor semiconductor device 800a-c.

Furthermore, prior to mounting, the sensor semiconductor device 800a-c may have conductive mounting material disposed in the apertures of the cover 815c thereof in preparation for electrically and/or mechanically coupling the contacts 807a-c of the sensor semiconductor device 800a-c to the second set of header pins 1007a-b and 1008a-b of the header assembly 1001a-b. The cover 815c of the sensor semiconductor device 800a-c may be mounted to the header glass 1003a-b using non-conductive mounting material. Also, the second set of header pins 1007a-b and 1008a-b of the header assembly 1001a-b may be electrically and/or mechanically coupled to the contacts 807a-c of the sensor semiconductor device 800a-c using the conductive mounting material placed in the apertures of the cover 815c thereof.

Similarly, prior to mounting, the electronic circuit semiconductor device 900a-c may have conductive mounting material disposed in the apertures of the cover 915c thereof in preparation for electrically and/or mechanically coupling the contacts 907a-c of the electronic circuit semiconductor device 900a-c to the first set of header pins 1005a-b and 1006a-b of the header assembly 1001a-b. The cover 915c of the electronic circuit semiconductor device 900a-c may be mounted to the header glass 1003a-b using non-conductive mounting material. Also, the first set of header pins 1005a-b and 1006a-b of the header assembly 1001a-b may be electrically and/or mechanically coupled to the contacts 907a-c of the electronic circuit semiconductor device 900a-c using the conductive mounting material placed in the apertures of the cover 915c thereof.

Alternatively, a first semiconductor substrate and a third semiconductor substrate having a second semiconductor substrate mounted thereon may be mechanically coupled to separate cover components. A sensor may be fabricated on the first semiconductor substrate and an electronic circuit may be fabricated on the second semiconductor substrate. In this approach, the first semiconductor substrate may be electrostatically bonded to a first cover at wafer level, while the second semiconductor substrate may be mounted to the third semiconductor substrate such as an SOI substrate with interconnections to the p+ layers and patterns of the SOI substrate done by wire bonding or other interconnection techniques, followed by electrostatic bonding of the third semiconductor substrate to the second cover. Subsequently, the first semiconductor substrate and the third semiconductor substrate may be diced using, for instance, a diamond saw or other wafer cutting techniques and may then be mounted to a header assembly or a printed circuit board (PCB). In addition, the first semiconductor substrate may be electrostatically bonded to the first cover at chip level or wafer level. Also, the third semiconductor substrate having the second semiconductor substrate mounted thereon may be electrostatically bonded to the second cover at chip level or wafer level.

Figure 11A:
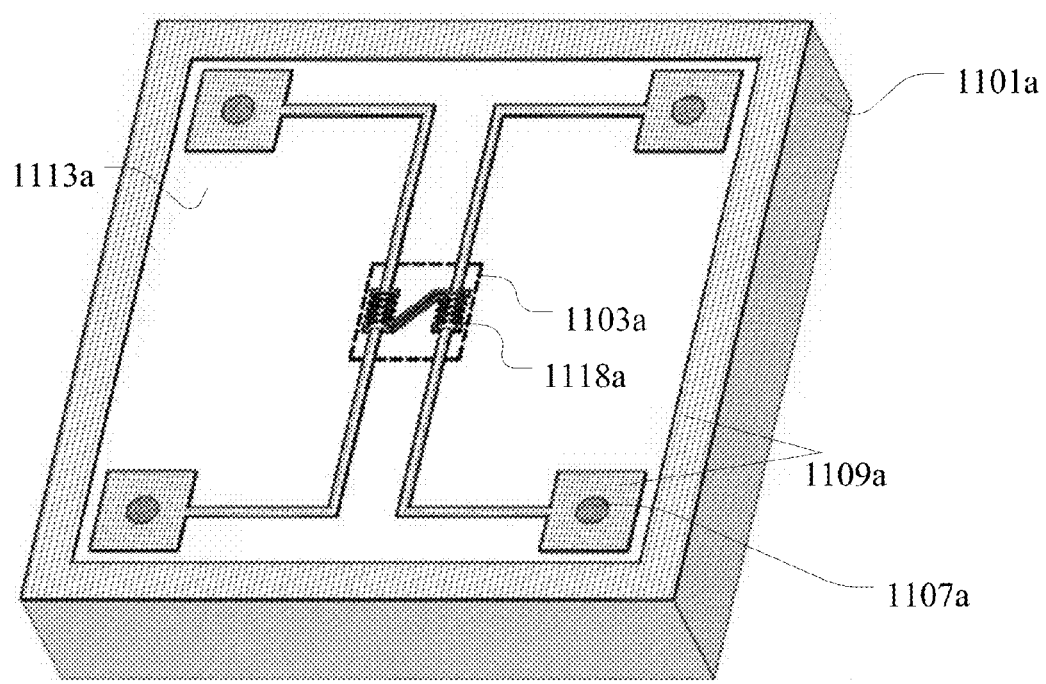
FIGS. 11A-11C are various views of one embodiment of a sensor semiconductor device in accordance with various aspects set forth herein.
Figure 11B:
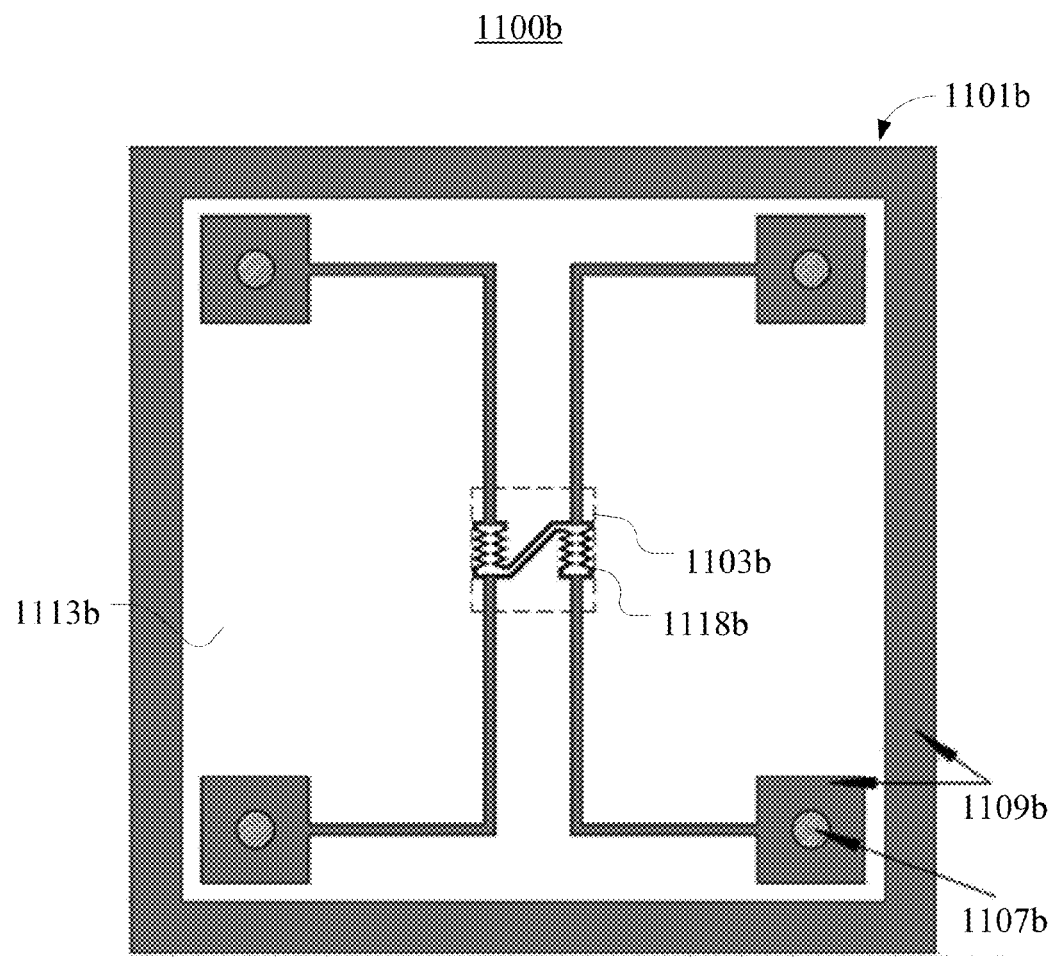
Figure 11C:
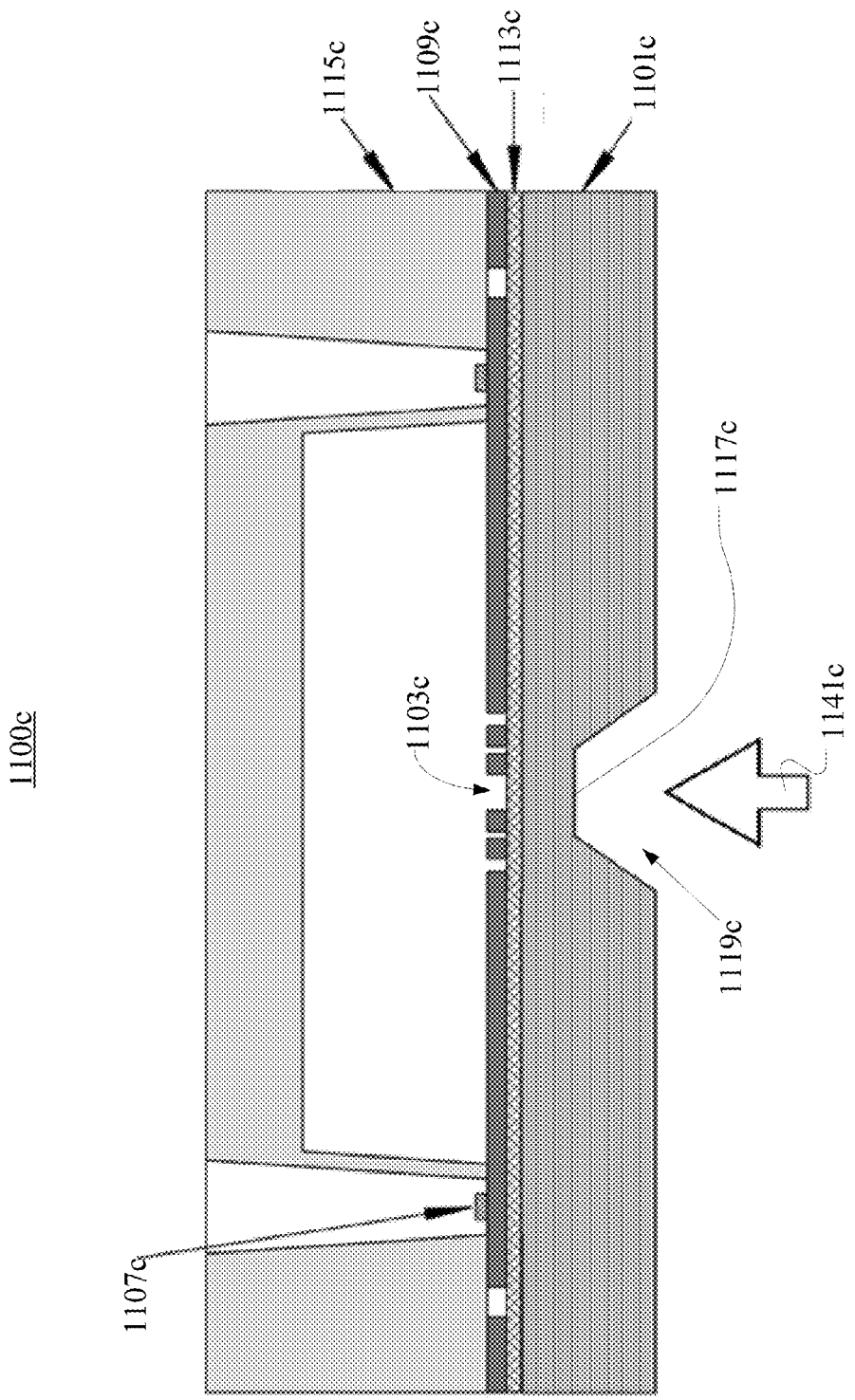

FIGS. 11A-11C are various views of one embodiment of a sensor semiconductor device 1100a-c in accordance with various aspects set forth herein. FIG. 11A is a perspective view of the sensor semiconductor device 1100a. FIG. 11B is a top view of the sensor semiconductor device 1100b. FIG. 11C is a cross-sectional side view of the sensor semiconductor device 1100c. In FIGS. 11A-11C, the sensor semiconductor device 1100a-c may be configured to include a first semiconductor substrate 1101a-c, a sensor 1103a-c, contacts 1107a-c, contact pads 1109a-c, a dielectric layer 1113a-c and a cover 1115c. According to certain example embodiments of the disclosed technology, the cover 1115c may be referred to as a contact glass. The sensor semiconductor device 1100a-c may be leadless. The contacts 1107a-c may be disposed on the contact pads 1109a-c. Further, the contacts 1107a-c and the contact pads 1109a-c may be added using wafer-level processing or micro-fabrication techniques. The dielectric layer 1113a-c may be used to isolate the sensor 1103a-c from the semiconductor substrate 1101a-c.

In FIG. 11A-C, the sensor 1103a-c may be configured to include a sensing element 1118a-b, a diaphragm 1117c and an aperture 1119c. The sensing element 1118a-b may be disposed on a front surface of the first semiconductor substrate 1101a-c. The region that defines a diaphragm 1117c may be disposed on a back surface of the first semiconductor substrate 1101a-c. Further, the region that defines a diaphragm 1117c may be opposite the sensing element 1118a-b. The aperture 1119c may be fabricated at the back surface of the first semiconductor substrate 1101a-c to form the diaphragm 1117c of the sensor 1103a-c. The aperture 1119c may allow an environmental condition 1141c such as a force or a pressure to be applied to the diaphragm 1117c. The deflection of the diaphragm 1117c by the environmental condition 1141c may induce a stress on the diaphragm 1117c, which may cause the resistance of each piezoresistor of the sensing element 1118a-b to change. The aperture 1119c may be shaped to form the diaphragm 1117c by using, for instance, etching techniques. The cover 1115c may be used to hermetically seal the sensing element 1118a-b by, for instance, electrostatically bonding the cover 1115c to the contact pads 1109a-c of first semiconductor substrate 1101c. The cover 1115c may be configured to include coaxial apertures, which may overlay the contacts 1107a-c.

Figure 12A:
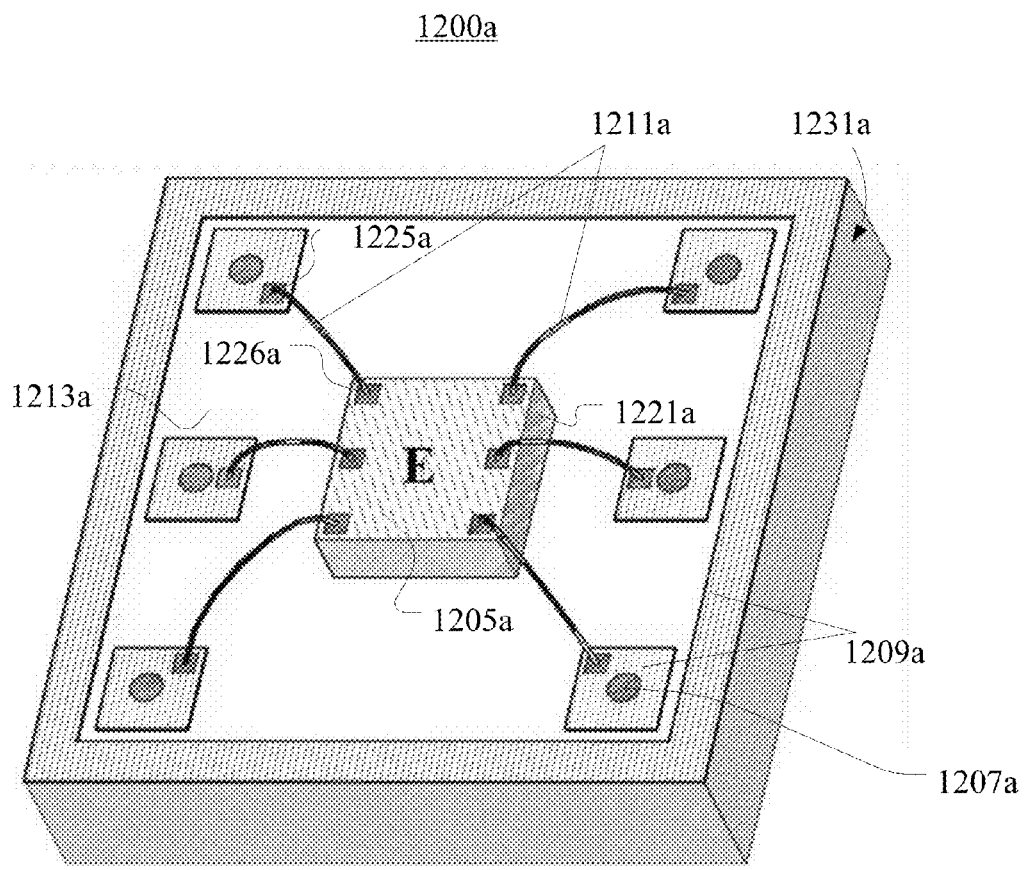
FIGS. 12A-12C are various views of one embodiment of an electronic circuit semiconductor device in accordance with various aspects set forth herein.
Figure 12B:
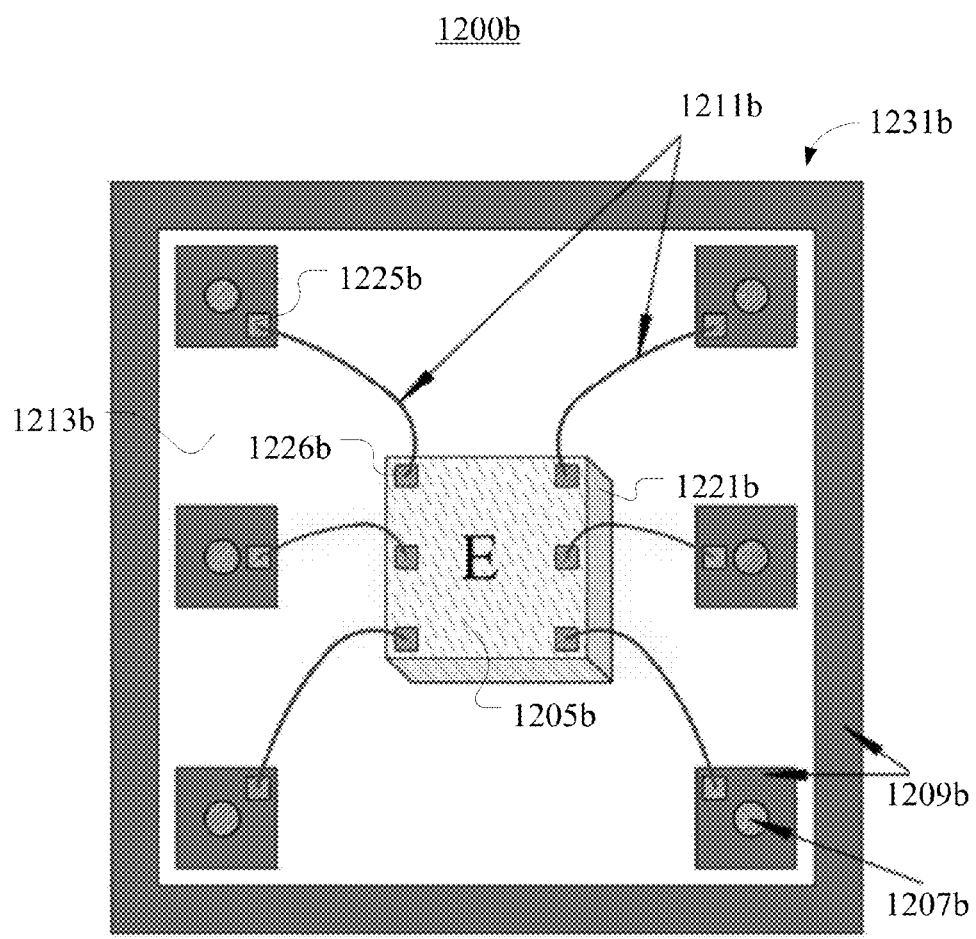
Figure 12C:
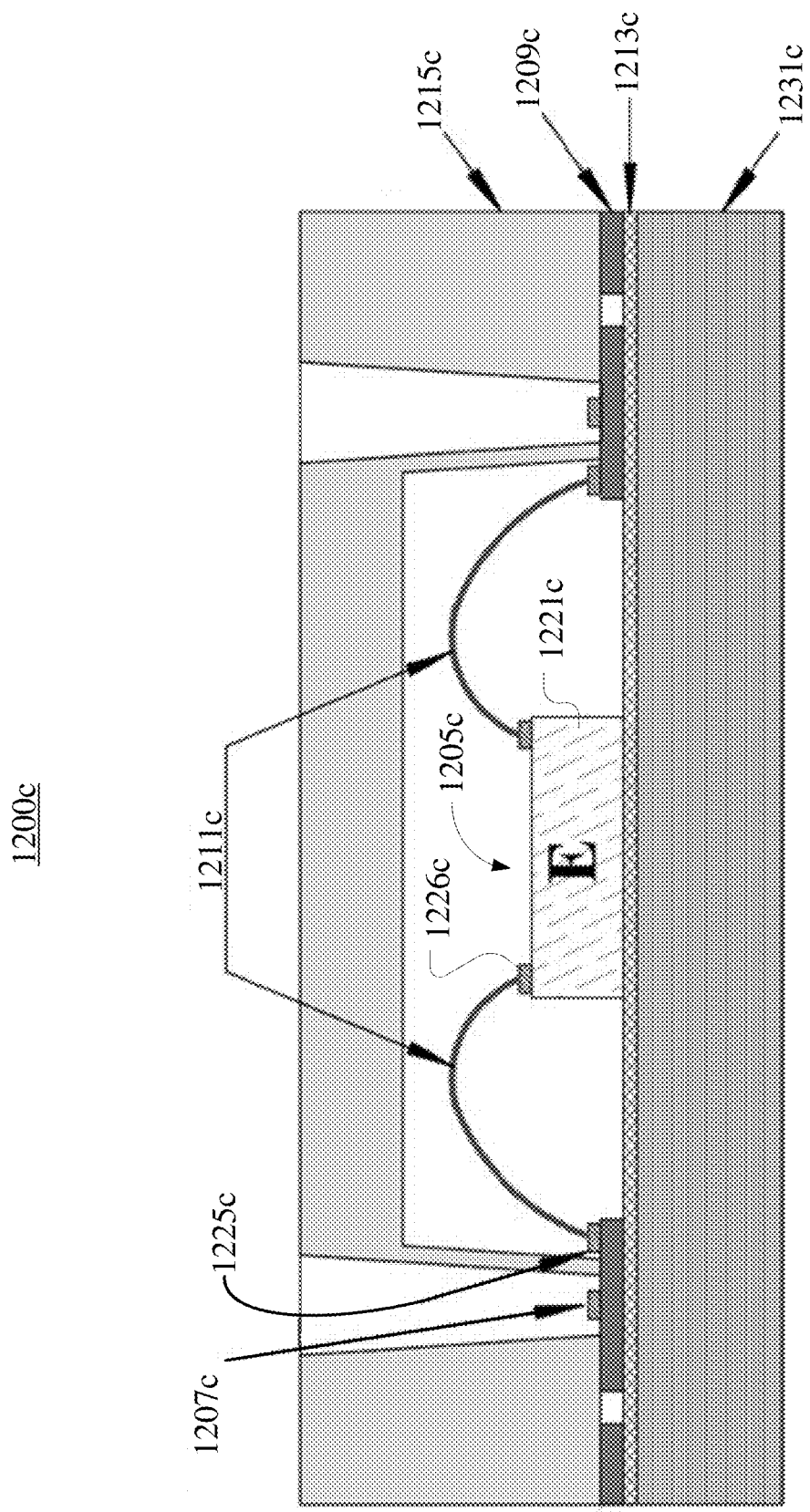

FIGS. 12A-12C are various views of one embodiment of an electronic circuit semiconductor device 1200a-c in accordance with various aspects set forth herein. FIG. 12A is a perspective view of the electronic circuit semiconductor device 1200a. FIG. 12B is a top view of the electronic circuit semiconductor device 1200b. FIG. 12C is a cross-sectional side view of the electronic circuit semiconductor device 1200c. In FIGS. 12A-12C, the electronic circuit semiconductor device 1200a-c may be configured to include a second semiconductor substrate 1221a-c, a third semiconductor substrate 1231a-c and a cover 1215c. According to certain example embodiments of the disclosed technology, the cover 1215c may be referred to as a contact glass. The electronic circuit semiconductor device 1200a-c may be leadless. The third semiconductor substrate 1231a-c may be configured to include contact pads 1209a-c, interconnections 1211a-c, a dielectric layer 1213a-c, first contacts 1207a-c and second contacts 1225a-c, which may be fabricated on the third semiconductor substrate 1231a-c using any conventional fabrication process for integrated circuits. The first contacts 1207a-c and the second contacts 1225a-c may be disposed on the contact pads 1209a-c of the third semiconductor substrate 1231a-c. Further, the first contacts 1207a-c, the second contacts 1225a-c and the contact pads 1209a-c may be added using wafer-level processing or micro-fabrication techniques. The first contacts 1207a-c may be electrically coupled to the second contacts 1225a-c using interconnections.

In FIG. 12, the second semiconductor substrate 1221a-c may be configured to include an electronic circuit 1205a-c and third contacts 1226a-c. The electronic circuit 1205a-c and the third contacts 1226a-c may be fabricated on the second semiconductor substrate 1221a-c using any conventional fabrication process for integrated circuits. The third contacts 1226a-c may be electrically coupled to the electronic circuit 1205a-c using interconnections. Further, the third contacts 1226a-c may be electrically coupled to the second contacts 1225a-c using the interconnections 1211a-c such as wire bonds. The dielectric layer 1213a-c may be used to isolate the second semiconductor substrate 1221a-c from the third semiconductor substrate 1231a-c. The cover 1215c may be used to hermetically seal the second semiconductor substrate 1221a-c by, for instance, electrostatically bonding the cover 1215c to the contact pads 1209a-c on the third semiconductor substrate 1231a-c. The cover 1215c may be configured to include apertures which may provide access for electrical connections to the metal contacts 1207a-c of the device, for example, via header pins.

FIG. 12C further depicts interconnect contacts 1225c on certain pads 1209a-c of the device 1200a-c, for example, that may provide electrical connection to the interconnections 1211a-c. In certain example implementations, these interconnect contacts 1225c may be positioned so that the cover 1215c may be used to hermetically seal the interconnect contacts 1225c and the electronic circuit 1205a-c within an enclosed region while allowing header pins to contact the metal contacts 1207a-c.

Figures 13A, 13B:
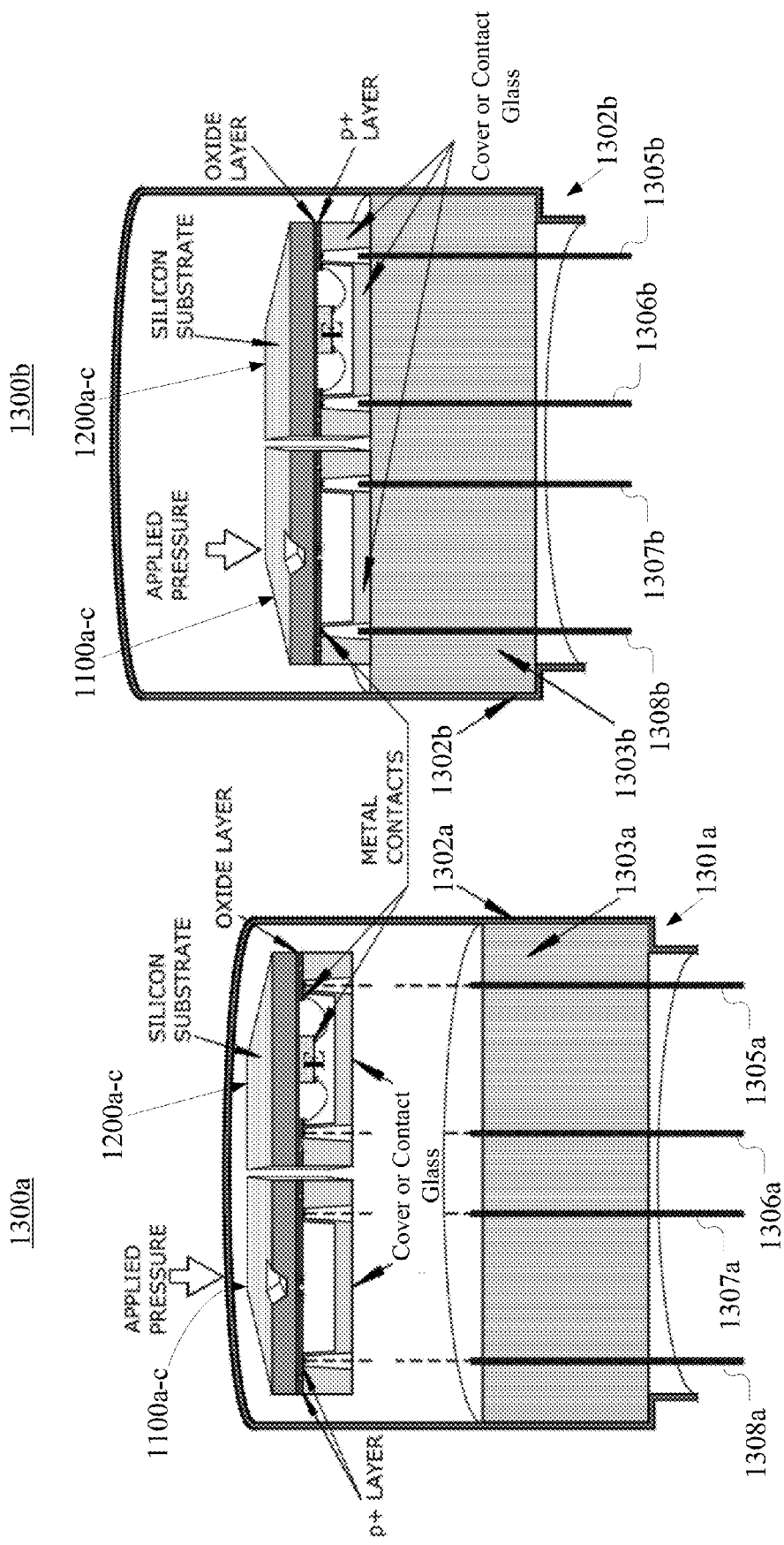
FIGS. 13A-13B are various cross-sectional side views of another embodiment of a sensor assembly having the sensor semiconductor device of FIGS. 11A-11C co-located with the electronic circuit semiconductor device of FIGS. 12A-12C in accordance with various aspects set forth herein.

FIGS. 13A-13B are various cross-sectional side views of another embodiment of a sensor assembly 1300a-b having the sensor semiconductor device 1100a-c of FIGS. 11A-11C and the electronic circuit semiconductor device 1200a-c of FIGS. 12A-12C in accordance with various aspects set forth herein. FIG. 13A is an unassembled cross-sectional side view of the sensor assembly 1300a. FIG. 13B is an assembled cross-sectional side view of the sensor assembly 1300b. In FIGS. 13A and 13B, the sensor assembly 1300a-b may be configured to include the sensor semiconductor device 1100a-c of FIGS. 11A-11C, the electronic circuit semiconductor device 1200a-c of FIGS. 12A-12C and a header assembly 1301a-b. The header assembly 1301a-b may be configured to include a header shell 1302a-b, a header glass 1303a-b, a first set of header pins 1305a-b and 1306a-b and a second set of header pins 1307a-b and 1308a-b. The header shell 1302a-b may be configured to include a flange at a bottom portion thereof. The header glass 1303a-b may be seated on the flange and may be hermetically bonded or sealed to the inner surface or the flange of the header shell 1302a-b. The header glass 1303a-b may be disposed around and may define coaxial apertures therein. The first set of header pins 1305a-b and 1306a-b and the second set of header pins 1307a-b and 1308a-b may be inserted into each aperture of the header glass 1303a-b. After insertion, a top portion of each header pin 1305a-b to 1308a-b may extend beyond a front surface of the header glass 1303a-b. Similarly, a bottom portion of each header pin 1305a-b to 1308a-b may extend beyond a back surface of the header glass 1303a-b. The header pins 1305a-b to 1308a-b may be hermetically bonded or sealed within the apertures of the header glass 1303a-b forming, for instance, a glass-to-metal seal.

In FIGS. 13A and 13B, a spacing of the first set of header pins 1305a-b and 1306a-b of the header assembly 1301a-b may correspond to a spacing of the apertures of the cover 1215c of the electronic circuit semiconductor device 1200a-c such that it may be mounted onto the header glass 1303a-b with the first set of header pins 1305a-b and 1306a-b positioned through the apertures of the cover 1215c to electrically couple with the contacts 1207a-c of the electronic circuit semiconductor device 1200a-c. Similarly, a spacing of the second set of header pins 1307a-b and 1308a-b of the header assembly 1301a-b may correspond to a spacing of the apertures of the cover 1115c of the sensor semiconductor device 1100a-c such that it may be mounted onto the header glass 1303a-b with the second set of header pins 1307a-b and 1308a-b positioned through the apertures of the cover 1115c to electrically couple with the contacts 1107a-c of the electronic circuit semiconductor device 1100a-c.

Furthermore, prior to mounting, the sensor semiconductor device 1100a-c may have conductive mounting material disposed in the apertures of the cover 1115c thereof in preparation for electrically and/or mechanically coupling the contacts 1107a-c of the sensor semiconductor device 1100a-c to the second set of header pins 1307a-b and 1308a-b of the header assembly 1301a-b. The cover 1115c of the sensor semiconductor device 1100a-c may be mounted to the header glass 1303a-b using non-conductive mounting material. Also, the second set of header pins 1307a-b and 1308a-b of the header assembly 1301a-b may be electrically and/or mechanically coupled to the contacts 1107a-c of the sensor semiconductor device 1100a-c using the conductive mounting material placed in the apertures of the cover 1115c thereof.

Similarly, prior to mounting, the electronic circuit semiconductor device 1200a-c may have conductive mounting material disposed in the apertures of the cover 1215c thereof in preparation for electrically and/or mechanically coupling the contacts 1207a-c of the electronic circuit semiconductor device 1200a-c to the first set of header pins 1305a-b and 1306a-b of the header assembly 1301a-b. The cover 1215c of the electronic circuit semiconductor device 1200a-c may be mounted to the header glass 1303a-b using non-conductive mounting material. Also, the first set of header pins 1305a-b and 1306a-b of the header assembly 1301a-b may be electrically and/or mechanically coupled to the first contacts 1207a-c of the electronic circuit semiconductor device 1200a-c using the conductive mounting material placed in the apertures of the cover 1215c thereof.

Alternatively, a first semiconductor substrate having a sensor and a second semiconductor substrate having an electronic circuit may be mounted onto a same cover component, resulting in a semiconductor device. In this approach, the first semiconductor substrate having the sensor may be electrostatically bonded to the cover at wafer level, while the second semiconductor substrate having the electronic circuit may be mounted to the cover at wafer level. In addition, the first semiconductor substrate having the sensor and the second semiconductor substrate having the electronic circuit may be electrostatically bonded to the same cover, which may be performed at chip level or wafer level. Subsequently, the resulting semiconductor device may be diced using a diamond saw or other wafer cutting techniques and may be mounted to a header assembly or a PCB.

Figure 14:
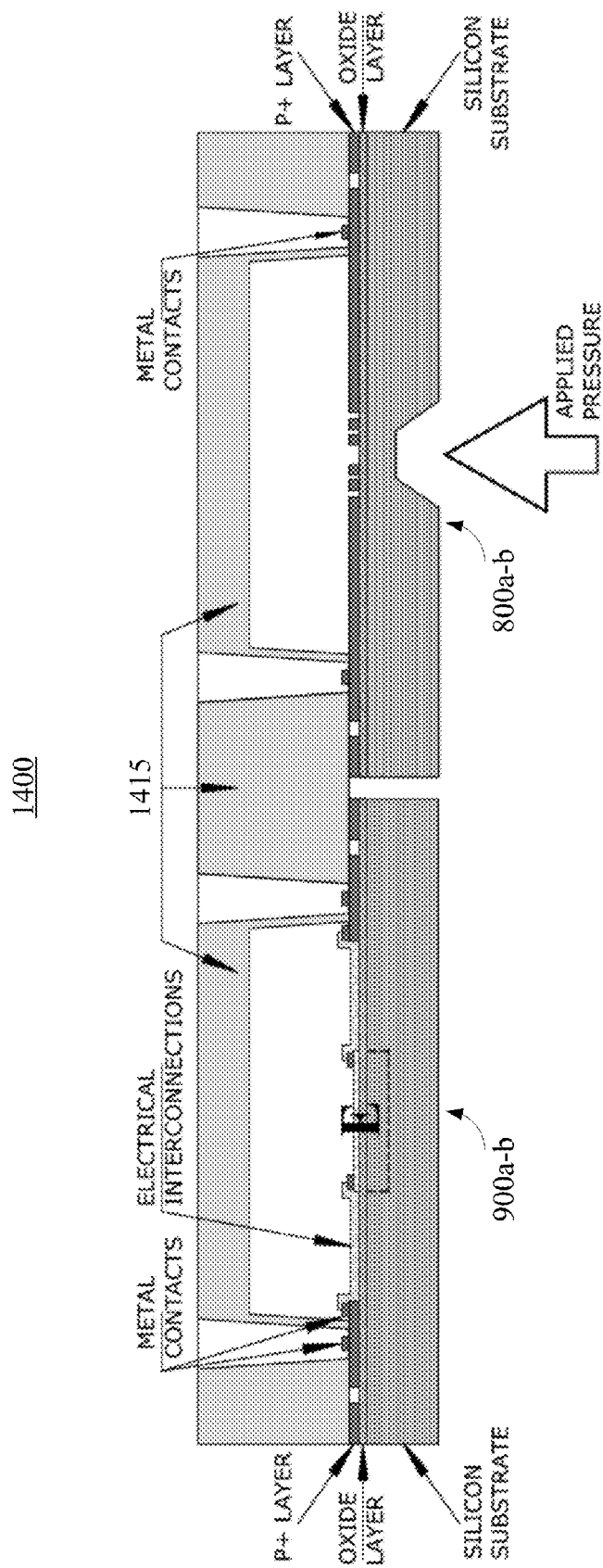
FIG. 14 is a cross-sectional side view of another embodiment of a semiconductor device having the sensor semiconductor device of FIGS. 8A-8B co-located with the electronic circuit semiconductor device of FIGS. 9A-9B in accordance with various aspects set forth herein.

FIG. 14 is a cross-sectional side view of another embodiment of a semiconductor device having the sensor semiconductor device 800a-b of FIGS. 8A-8B co-located with the electronic circuit semiconductor device 900a-b of FIGS. 9A-9B in accordance with various aspects set forth herein. In FIG. 14, a cover 1415 such as a glass cover may be used to hermetically seal the sensor semiconductor device 800a-b and the electronic circuit semiconductor device 900a-b by, for instance, electrostatically bonding the cover 1415 to the contact pads 809a-b of the sensor semiconductor device 800a-b and the contact pads 909a-b of the electronic circuit semiconductor device 900a-b. The cover 1415 may be configured to include coaxial apertures, which may overlay the metal contacts 807a-b of the sensor semiconductor device 800a-b and the metal contacts 907a-b of the electronic circuit semiconductor device 900a-b.

Figures 15A, 15B:
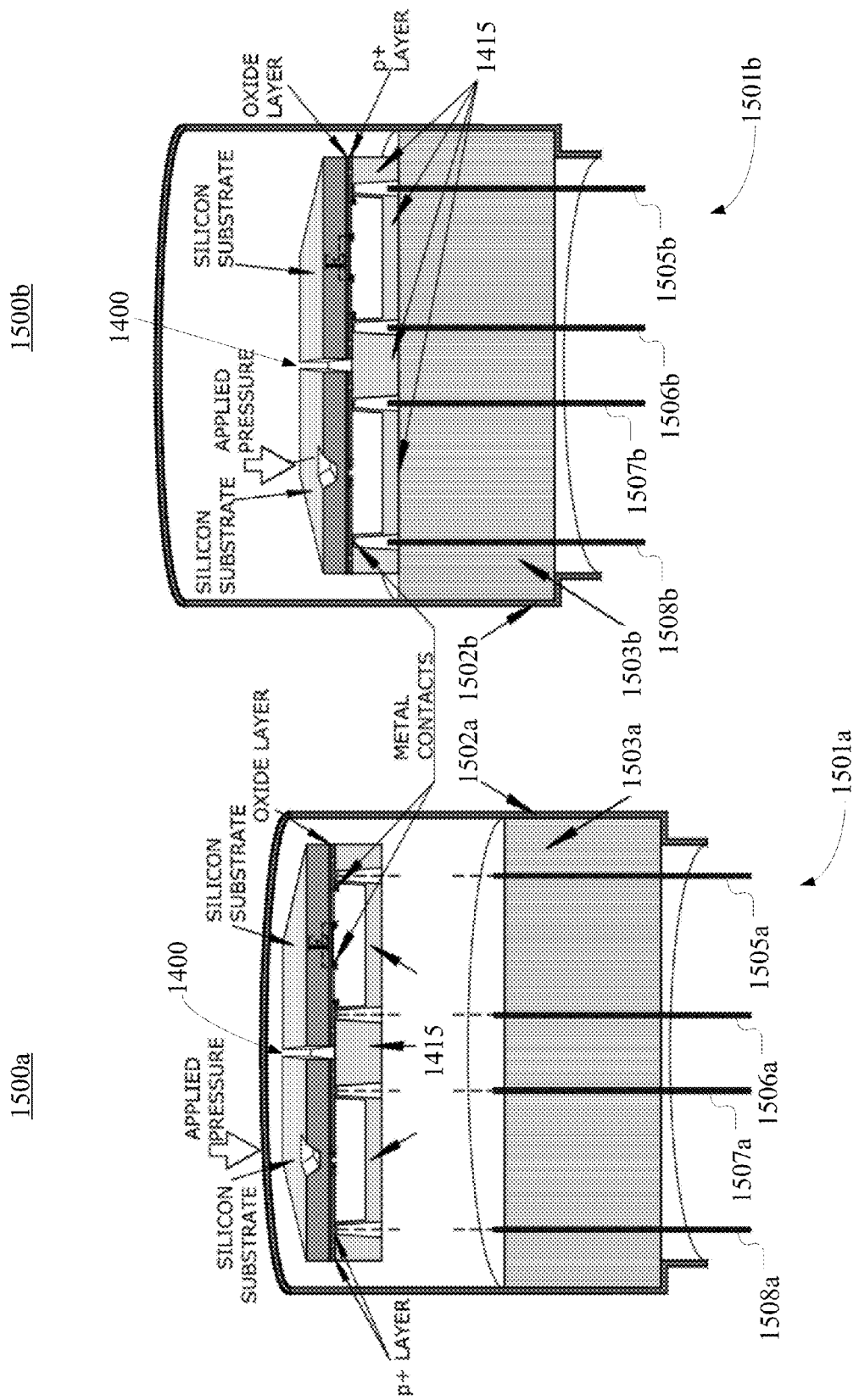
FIGS. 15A-15B are various cross-sectional side views of another embodiment of a sensor assembly having the semiconductor device of FIG. 14 in accordance with various aspects set forth herein.

FIGS. 15A-15B are various cross-sectional side views of another embodiment of a sensor assembly 1500a-b having the semiconductor device 1400 of FIG. 14 in accordance with various aspects set forth herein. FIG. 15A is an unassembled cross-sectional side view of the sensor assembly 1500a. FIG. 15B is an assembled cross-sectional side view of the sensor assembly 1500b. In FIGS. 15A and 15B, the sensor assembly 1500a-b may be configured to include the semiconductor device 1400 of FIG. 14 and a header assembly 1501a-b. The header assembly 1501a-b may be configured to include a header shell 1502a-b, a header glass 1503a-b, a first set of header pins 1505a-b and 1506a-b and a second set of header pins 1507a-b and 1508a-b. The header shell 1502a-b may be configured to include a flange at a bottom portion thereof. The header glass 1503a-b may be seated on the flange and may be hermetically bonded or sealed to the inner surface or the flange of the header shell 1502a-b. The header glass 1503a-b may be disposed around and may define coaxial apertures therein. The first set of header pins 1505a-b and 1506a-b and the second set of header pins 1507a-b and 1508a-b may be inserted into each aperture of the header glass 1503a-b.

In FIGS. 15A and 15B, a spacing of the first set of header pins 1505a-b and 1506a-b of the header assembly 1501a-b may correspond to a spacing of the apertures of the cover 1415 of the semiconductor device 1400 associated with the electronic circuit semiconductor device 900a-b of FIGS. 9A-9B such that it may be mounted onto the header glass 1503a-b with the first set of header pins 1505a-b and 1506a-b positioned through the apertures of the cover 1415 to electrically couple with the contacts 907a-c of the electronic circuit semiconductor device 900a-b. Similarly, a spacing of the second set of header pins 1507a-b and 1508a-b of the header assembly 1501a-b may correspond to a spacing of the apertures of the cover 1415 of the semiconductor device 1400 associated with the sensor semiconductor device 800a-b such that it may be mounted onto the header glass 1503a-b with the second set of header pins 1507a-b and 1508a-b positioned through the apertures of the cover 1415 to electrically couple with the contacts 807a-b of the sensor semiconductor device 800a-b.

Furthermore, prior to mounting, the semiconductor device 1400 may have conductive mounting material disposed in the apertures of the cover 1415 thereof in preparation for electrically and/or mechanically coupling the contacts 807a-b of the sensor semiconductor device 800a-b to the second set of header pins 1507*a-b* and 1508*a-b* and the contacts 907*a-b* of the electronic circuit semiconductor device 900*a-b* to the first set of header pins 1505*a-b* and 1506*a-b*. The cover 1415 of the semiconductor device 1400 may be mounted to the header glass 1503*a-b* using non-conductive mounting material. The first set of header pins 1505*a-b* and 1506*a-b* may be electrically and/or mechanically coupled to the contacts 907*a-b* of the electronic circuit semiconductor device 900*a-b* using the conductive mounting material placed in the apertures of the cover 1415 of the semiconductor device 1400. Also, the second set of header pins 1507*a-b* and 1508*a-b* may be electrically and/or mechanically coupled to the contacts 807*a-b* of the sensor semiconductor device 800*a-b* using the conductive mounting material placed in the apertures of the cover 1415 of the semiconductor device 1400.

Alternatively, a first semiconductor substrate and a third semiconductor substrate with a second semiconductor substrate mounted thereon may be mounted onto a same cover component, resulting in a semiconductor device. A sensor may be fabricated on the first semiconductor substrate and an electronic circuit may be fabricated on the second semiconductor substrate. In this approach, the first semiconductor substrate having the sensor may be electrostatically bonded to the cover at wafer level, while the second semiconductor substrate may be mounted to the third semiconductor substrate such as an SOI substrate with interconnections to the p+ layers and patterns of the SOI substrate done by wire bonding or other interconnection techniques, followed by electrostatic bonding of the third semiconductor substrate to the same cover at wafer level. Subsequently, the resulting semiconductor device may be diced using a diamond saw or other wafer cutting techniques and may be mounted to a header assembly or a PCB.

Figure 16:
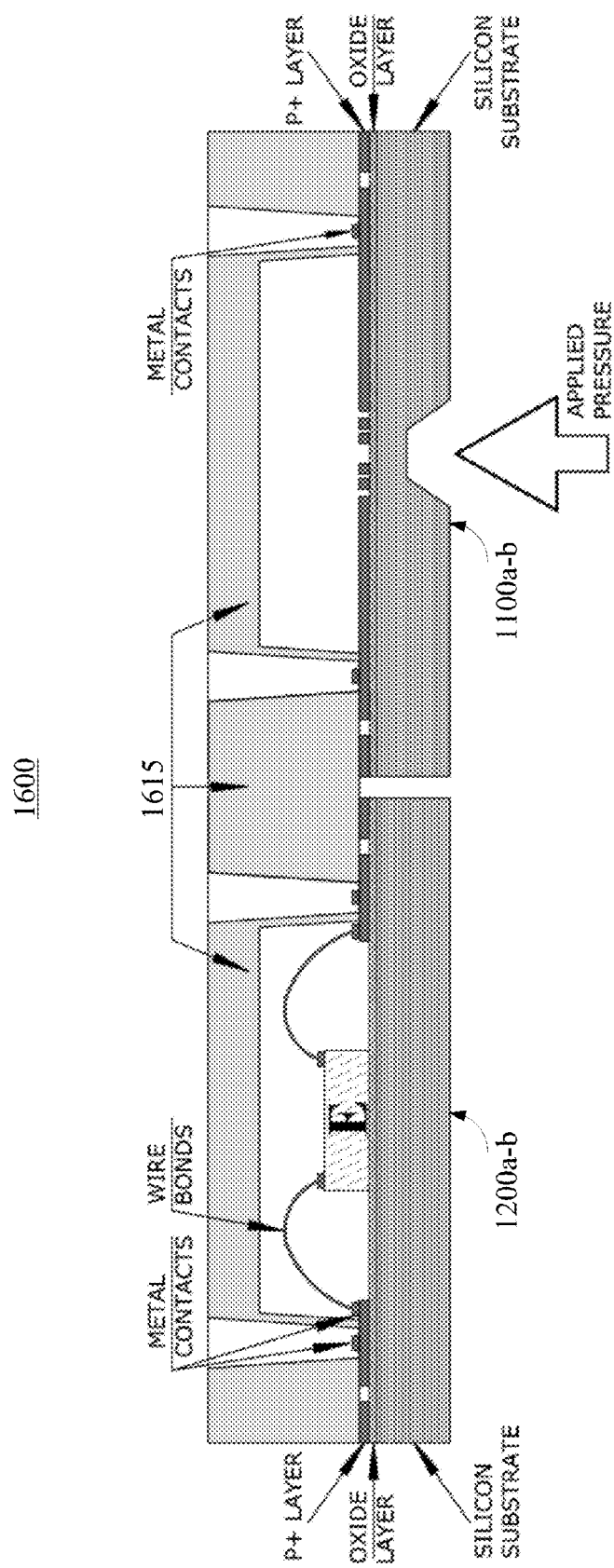
FIG. 16 is a cross-sectional side view of another embodiment of a semiconductor device having the sensor semiconductor device of FIGS. 11A-11B co-located with the electronic circuit semiconductor device of FIGS. 12A-12B in accordance with various aspects set forth herein.

FIG. 16 is a cross-sectional side view of another embodiment of a semiconductor device having the sensor semiconductor device 1100*a-b* of FIGS. 11A-11B co-located with the electronic circuit semiconductor device 1200*a-b* of FIGS. 12A-12B in accordance with various aspects set forth herein. In FIG. 16, a cover 1615 may be used to hermetically seal the sensing element 1118*a-b* and the electronic circuit 1205*a-c* by, for instance, electrostatically bonding the cover 1615 to the contact pads 1109*a-b* of the sensor semiconductor device 1100*a-b* and the contact pads 1209*a-b* of the electronic circuit semiconductor device 1200*a-b*. The cover 1615 may be configured to include coaxial apertures, which may overlay the metal contacts 1107*a-b* of the sensor semiconductor device 1100*a-b* and the metal contacts 1207*a-b* of the electronic circuit semiconductor device 1200*a-b*.

Figures 17A, 17B:
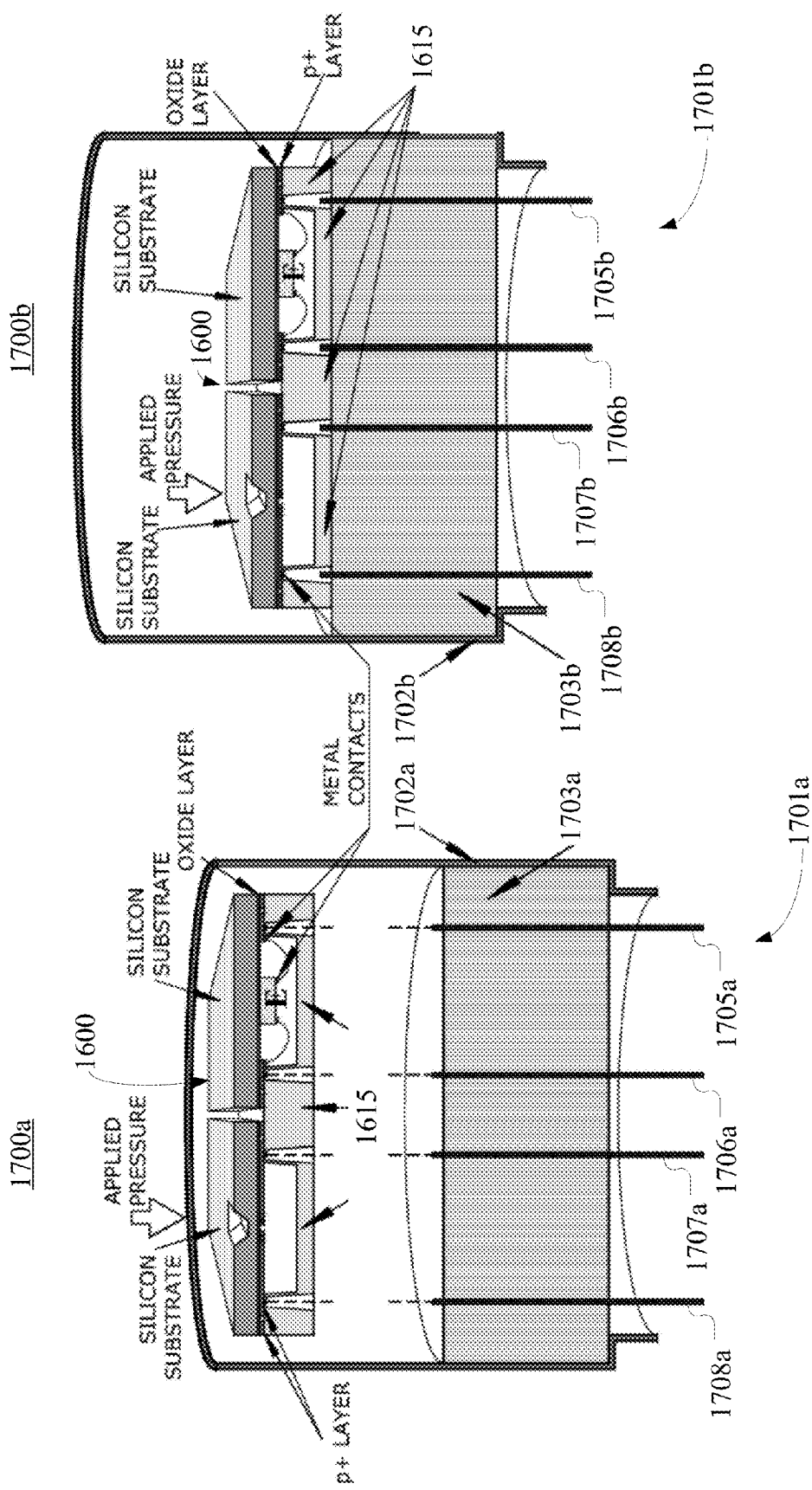
FIGS. 17A-17B are various cross-sectional side views of another embodiment of a sensor assembly having the semiconductor device of FIG. 16 in accordance with various aspects set forth herein.

FIGS. 17A-17B are various cross-sectional side views of another embodiment of a sensor assembly 1700*a-b* having the semiconductor device 1600 of FIG. 16 in accordance with various aspects set forth herein. FIG. 17A is an unassembled cross-sectional side view of the sensor assembly 1700*a*. FIG. 17B is an assembled cross-sectional side view of the sensor assembly 1700*b*. In FIGS. 17A and 17B, the sensor assembly 1700*a-b* may be configured to include the semiconductor device 1600 of FIG. 16 and a header assembly 1701*a-b*. The header assembly 1701*a-b* may be configured to include a header shell 1702*a-b*, a header glass 1703*a-b*, a first set of header pins 1705*a-b* and 1706*a-b* and a second set of header pins 1707*a-b* and 1708*a-b*. The header shell 1702*a-b* may be configured to include a flange at a bottom portion thereof. The header glass 1703*a-b* may be seated on the flange and may be hermetically bonded or sealed to the inner surface or the flange of the header shell 1702*a-b*. The header glass 1703*a-b* may be disposed around and may define coaxial apertures therein. The first set of header pins 1705*a-b* and 1706*a-b* and the second set of header pins 1707*a-b* and 1708*a-b* may be inserted into each aperture of the header glass 1703*a-b*.

In FIGS. 17A and 17B, a spacing of the first set of header pins 1705*a-b* and 1706*a-b* of the header assembly 1701*a-b* may correspond to a spacing of the apertures of the cover 1615 of the semiconductor device 1600 associated with the electronic circuit semiconductor device 1200*a-b* of FIGS. 12A-12B such that it may be mounted onto the header glass 1703*a-b* with the first set of header pins 1705*a-b* and 1706*a-b* positioned through the apertures of the cover 1615 to electrically couple with the contacts 1207*a-c* of the electronic circuit semiconductor device 1200*a-b*. Similarly, a spacing of the second set of header pins 1707*a-b* and 1708*a-b* of the header assembly 1701*a-b* may correspond to a spacing of the apertures of the cover 1615 of the semiconductor device 1600 associated with the sensor semiconductor device 1100*a-b* such that it may be mounted onto the header glass 1703*a-b* with the second set of header pins 1707*a-b* and 1708*a-b* positioned through the apertures of the cover 1615 to electrically couple with the contacts 1107*a-b* of the sensor semiconductor device 1100*a-b*.

Furthermore, prior to mounting, the semiconductor device 1600 may have conductive mounting material disposed in the apertures of the cover 1615 thereof in preparation for electrically and/or mechanically coupling the contacts 1107*a-b* of the sensor semiconductor device 1100*a-b* to the second set of header pins 1707*a-b* and 1708*a-b* and the contacts 1207*a-b* of the electronic circuit semiconductor device 1200*a-b* to the first set of header pins 1705*a-b* and 1706*a-b*. The cover 1615 of the semiconductor device 1600 may be mounted to the (glass or ceramic) header glass 1703*a-b* using non-conductive mounting material. The first set of header pins 1705*a-b* and 1706*a-b* may be electrically and/or mechanically coupled to the contacts 1207*a-b* of the electronic circuit semiconductor device 1200*a-b* using the conductive mounting material placed in the apertures of the cover 1615 of the semiconductor device 1600. Also, the second set of header pins 1707*a-b* and 1708*a-b* may be electrically and/or mechanically coupled to the contacts 1107*a-b* of the sensor semiconductor device 1100*a-b* using the conductive mounting material placed in the apertures of the cover 1615 of the semiconductor device 1600.

In accordance with certain example implementations of the disclosed technology, certain sensor assemblies are provided that can provide the technical benefit of having a sensing element integrated in the same package with interface electronics. According to an example implementation, the sensing element and the electronics may be hermetically sealed in the same package. In one example implementation, the sensing components and the electronics may be hermetically sealed in the same enclosure of the package using, for example, a cover such as a contact glass. In another example implementation, the sensing components and the electronics may be hermetically sealed in their own enclosures (for example, with separate contact glass covers), but placed in the same package.

Example implementations include a sensor assembly that is capable of outputting an environmental condition signal associated with an environmental condition measured by a sensor. For example, the sensor assembly includes a semiconductor device that includes a sensor having a sensing element and an electronic circuit. The sensing element and the electronic circuit are hermetically sealed in a package together.

In an example implementation, the semiconductor device further includes a first semiconductor substrate having a front surface and a back surface. The sensor is configured to include the sensing element disposed on the front surface of the first semiconductor substrate and a region that defines a diaphragm disposed on the back surface of the first semiconductor substrate and about opposite to the sensing element. The electronic circuit may be disposed on the front surface of the first semiconductor substrate and may be electrically coupled with the sensing element.

In certain example implementations, the semiconductor device is further configured to include a contact glass coupled to the front surface of the first semiconductor substrate and used to hermetically seal the sensing element and the electronic device.

In one example implementation, the semiconductor device is further configured to include a first semiconductor substrate having a front surface and a back surface, and a second semiconductor substrate having a front surface and a back surface, wherein the electronic circuit may be disposed on the front surface of the second semiconductor substrate, and the sensing element may be disposed on the front surface of the first semiconductor substrate and electrically coupled with the electronic circuit. In an example implementation, a region that defines a diaphragm may be disposed on the back surface of the first semiconductor substrate and about opposite to the sensing element.

In accordance with an example implementation, the semiconductor device may further include a first contact glass cover coupled to the front surface of at least the first semiconductor substrate and used to hermetically seal the sensing element. The semiconductor device may further include a second contact glass coupled to the front surface of at least the second semiconductor substrate and used to hermetically seal the electronic circuit.

According to an example implementation of the disclosed technology, the sensor assembly can include a header assembly that includes a header glass coupled to the semiconductor device and a first set of header pins. In an example implementation, the electronic circuit may be electrically coupled to the sensing element and the first set of header pins.

In certain example implementations, the electronic circuit can include one or more of an amplifier, active electronics, passive electronics, compensating electronics, etc.

In certain example implementations, the header assembly of the sensor assembly can include a header glass coupled to the semiconductor device, a first set of header pins electrically and coupled to the electronic circuit, and a second set of header pins electrically and coupled to the sensing element.

According to an example implementation of the disclosed technology, the semiconductor device may further include a first contact glass coupled to the front surface of the first semiconductor substrate. The first contact glass may be used to hermetically seal the sensing element. According to an example implementation of the disclosed technology, the semiconductor device may further include a second contact glass coupled to the front surface of the second semiconductor substrate. The second contact glass may be used to hermetically seal the electronic circuit.

In certain example implementations, the semiconductor device may include a contact glass coupled to the front surface of the first semiconductor substrate and the front surface of the second semiconductor substrate. The contact glass, in certain example implementations, may be used to hermetically seal both the sensing element and the electronic device in the same enclosure within the sensor assembly package.

According to an example implementation of the disclosed technology, the semiconductor device may further include a first semiconductor substrate having a front surface and a back surface, and a second semiconductor substrate having a front surface and a back surface. The electronic circuit may be disposed on the front surface of the second semiconductor substrate. The semiconductor device may further include a third semiconductor substrate having a front surface and a back surface, wherein the back surface of the first semiconductor substrate and the back surface of the second semiconductor substrate are coupled to the front surface of the third semiconductor substrate. In certain example implementations, the sensor may be configured to include a region that defines a diaphragm disposed on the back surface of the first semiconductor substrate and about opposite to the sensing element. In certain example implementations, the sensing element may be disposed on the front surface of the first semiconductor substrate, and the third semiconductor substrate may be disposed around and may define an aperture such that the aperture is coupled to the diaphragm of the sensor.

In certain example implementations, the sensor assembly can include a header assembly. The header assembly may include a header glass coupled to the semiconductor device, and a first set of header pins. In certain example implementations, the electronic circuit may be electrically coupled to the sensing element and the first set of header pins.

In an example implementation, the sensor assembly can include a header assembly. The header assembly may include a header glass coupled to the semiconductor device, a first set of header pins electrically and coupled to the electronic circuit, and a second set of header pins. The semiconductor device may further include a first semiconductor substrate having a front surface and a back surface, a second semiconductor substrate having a front surface and a back surface, wherein the electronic circuit is disposed on the front surface of the second semiconductor substrate, and a third semiconductor substrate having a front surface and a back surface, wherein the back surface of the second semiconductor substrate is coupled to the front surface of the third semiconductor substrate. The sensor may be further configured to include a region that defines a diaphragm disposed on the back surface of the first semiconductor substrate opposite to the sensing element. In certain example implementations, the sensing element may be disposed on the front surface of the first semiconductor substrate and may be electrically and/or mechanically coupled to the second set of header pins.

In certain example implementations, the semiconductor device may include a first contact glass coupled to the front surface of the first semiconductor substrate and used to hermetically seal the sensing element. In certain example implementations, the semiconductor device may include a second contact glass coupled to the front surface of the third semiconductor substrate and used to hermetically seal the electronic circuit.

In certain example implementations, the semiconductor device can further include a contact glass coupled to the front surface of the first semiconductor substrate and the front surface of the third semiconductor substrate. The contact glass may hermetically seal the sensing element and the electronic circuit.

In certain example implementations, the sensor assembly may include a header assembly that includes a header glass coupled to the semiconductor device, and a first set of header pins electrically and coupled to the electronic circuit.

In accordance with an example implementation, the semiconductor device may be coupled to the header glass using non-conductive mounting material. In certain example implementations, the electronic circuit may be electrically and/or mechanically coupled to the first set of header pins using electrically conductive mounting material. In certain example implementations, the semiconductor device further includes a contact glass, wherein the contact glass is used to hermetically seal the sensing element and the electronic circuit.

In certain example implementations, the electronic circuit may be configured to provide a regulated voltage or a regulated current to the sensing element. In certain example implementations, the electronic circuit may be configured to modify an amplitude of the environmental condition signal output by the sensing element.

It is important to recognize that it is impractical to describe every conceivable combination of components or methodologies for purposes of describing the claimed subject matter. However, a person having ordinary skill in the art will recognize that many further combinations and permutations of the subject technology are possible. Accordingly, the claimed subject matter is intended to cover all such alterations, modifications, and variations that are within the spirit and scope of the claimed subject matter.

Although the present disclosure describes specific examples, embodiments, and the like, various modifications and changes may be made without departing from the scope of the present disclosure as set forth in the claims below. For example, although the example methods, devices and systems, described herein are in conjunction with a configuration for the aforementioned sensor co-located with an electronic circuit, the skilled artisan will readily recognize that the example methods, devices or systems may be used in other methods, devices or systems and may be configured to correspond to such other example methods, devices or systems as needed. Further, while at least one example, embodiment, or the like has been presented in the foregoing detailed description, many variations exist. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all of the claims. Any benefits, advantages, or solutions to problems that are described herein with regard to specific examples, embodiments, or the like are not intended to be construed as a critical, required, or essential feature or element of any or all of the claims.

What is claimed is:

1. A sensor assembly, comprising:
   a semiconductor device configured to include:
      a sensor having a sensing element;
      an electronic circuit; and
      wherein the sensing element and the electronic circuit are hermetically sealed in a package together;
   a header assembly configured to include:
      a header glass coupled to the semiconductor device; and
      a first set of header pins electrically coupled to the electronic circuit; and
   wherein the sensor assembly is capable of outputting an environmental condition signal associated with an environmental condition measured by the sensor.

2. The sensor assembly of claim 1, wherein the semiconductor device further includes:
   a first semiconductor substrate having a front surface and a back surface;
   wherein the sensor is configured to include:
      the sensing element disposed on the front surface of the first semiconductor substrate; and
      a region that defines a diaphragm disposed on the back surface of the first semiconductor substrate and about opposite to the sensing element; and
   wherein the electronic circuit is disposed on the front surface of the first semiconductor substrate and is electrically coupled with the sensing element.

3. The sensor assembly of claim 2, wherein the semiconductor device is further configured to include:
   a contact glass coupled to the front surface of the first semiconductor substrate and used to hermetically seal the sensing element and the electronic device.

4. The sensor assembly of claim 1, wherein the semiconductor device is further configured to include:
   a first semiconductor substrate having a front surface and a back surface;
   a second semiconductor substrate having a front surface and a back surface, wherein the electronic circuit is disposed on the front surface of the second semiconductor substrate; and
   wherein the sensor is configured to include:
      the sensing element disposed on the front surface of the first semiconductor substrate, wherein the sensing element is electrically coupled with the electronic circuit; and
      a region that defines a diaphragm disposed on the back surface of the first semiconductor substrate and about opposite to the sensing element.

5. The sensor assembly of claim 4, wherein the semiconductor device is further configured to include:
   a first contact glass coupled to the front surface of at least the first semiconductor substrate and used to hermetically seal the sensing element; and
   a second contact glass coupled to the front surface of at least the second semiconductor substrate and used to hermetically seal the electronic circuit.

6. The sensor assembly of claim 1, further comprising:
   a header assembly configured to include:
      a header glass coupled to the semiconductor device; and
      a first set of header pins; and
   wherein the electronic circuit is electrically coupled to the sensing element and the first set of header pins.

7. The sensor assembly of claim 1, wherein the electronic circuit comprises one or more of an amplifier, active electronics, a voltage regulator, and compensating electronics.

8. The sensor assembly of claim 4, further comprising:
   a header assembly configured to include:
      a header glass coupled to the semiconductor device;
      a first set of header pins electrically and coupled to the electronic circuit; and
      a second set of header pins electrically and coupled to the sensing element.

9. The sensor assembly of claim 8, wherein the semiconductor device is further configured to include:
   a first contact glass coupled to the front surface of the first semiconductor substrate, wherein the first contact glass is used to hermetically seal the sensing element; and
   a second contact glass coupled to the front surface of the second semiconductor substrate, wherein the second contact glass is used to hermetically seal the electronic circuit.

10. The sensor assembly of claim 8, wherein the semiconductor device is further configured to include:
    a contact glass coupled to the front surface of the first semiconductor substrate and the front surface of the second semiconductor substrate and used to hermetically seal the sensing element and the electronic device.

11. The sensor assembly of claim 1, wherein the semiconductor device further includes:
    a first semiconductor substrate having a front surface and a back surface;

a second semiconductor substrate having a front surface and a back surface, wherein the electronic circuit is disposed on the front surface of the second semiconductor substrate;

a third semiconductor substrate having a front surface and a back surface, wherein the back surface of the first semiconductor substrate and the back surface of the second semiconductor substrate are coupled to the front surface of the third semiconductor substrate;

wherein the sensor is configured to include:
   a region that defines a diaphragm disposed on the back surface of the first semiconductor substrate and about opposite to the sensing element; and
   wherein the sensing element is disposed on the front surface of the first semiconductor substrate; and wherein the third semiconductor substrate is disposed around and defines an aperture such that the aperture is coupled to the region that defines the diaphragm of the sensor.

12. The sensor assembly of claim 11, further comprising:
a header assembly configured to include:
   a header glass coupled to the semiconductor device; and
   a first set of header pins; and
wherein the electronic circuit is electrically coupled to the sensing element and the first set of header pins.

13. The sensor assembly of claim 1, further comprising:
a header assembly configured to include:
   a header glass coupled to the semiconductor device;
   a first set of header pins electrically and coupled to the electronic circuit; and
   a second set of header pins; and
wherein the semiconductor device further includes:
   a first semiconductor substrate having a front surface and a back surface;
   a second semiconductor substrate having a front surface and a back surface, wherein the electronic circuit is disposed on the front surface of the second semiconductor substrate;
   a third semiconductor substrate having a front surface and a back surface, wherein the back surface of the second semiconductor substrate is coupled to the front surface of the third semiconductor substrate; and wherein the sensor is further configured to include:
   a region that defines a diaphragm disposed on the back surface of the first semiconductor substrate opposite to the sensing element; and
   wherein the sensing element is disposed on the front surface of the first semiconductor substrate and is electrically and coupled to the second set of header pins.

14. The sensor assembly of claim 13, wherein the semiconductor device is further configured to include:
a first contact glass coupled to the front surface of the first semiconductor substrate and used to hermetically seal the sensing element; and
a second contact glass coupled to the front surface of the third semiconductor substrate and used to hermetically seal the electronic circuit.

15. The sensor assembly of claim 13, wherein the semiconductor device further includes:
a contact glass coupled to the front surface of the first semiconductor substrate and the front surface of the third semiconductor substrate, wherein the contact glass is used to hermetically seal the sensing element and the electronic circuit.

16. The sensor assembly of claim 1, wherein the semiconductor device is coupled to the header glass using non-conductive mounting material and the electronic circuit is coupled to the first set of header pins using electrically conductive mounting material.

17. The sensor assembly of claim 1, wherein the electronic circuit is used to provide a regulated voltage or a regulated current to the sensing element.

18. The sensor assembly of claim 1, wherein the electronic circuit is used to modify an amplitude of the environmental condition signal output by the sensing element, wherein the environmental condition comprises one or more of pressure, force, and temperature.

19. The sensor assembly of claim 1, wherein the semiconductor device further includes:
a contact glass, wherein the contact glass is used to hermetically seal the sensing element and the electronic circuit.

* * * * *